US012200932B2

(12) United States Patent
Yamashita et al.

(10) Patent No.: US 12,200,932 B2
(45) Date of Patent: Jan. 14, 2025

(54) THREE-DIMENSIONAL MEMORY DEVICE AND METHOD OF MAKING THE SAME USING DIFFERENTIAL THINNING OF VERTICAL CHANNELS

(71) Applicant: SANDISK TECHNOLOGIES LLC, Addison, TX (US)

(72) Inventors: Kosaku Yamashita, Yokkaichi (JP); Yasuaki Yonemochi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 484 days.

(21) Appl. No.: 17/532,015

(22) Filed: Nov. 22, 2021

(65) Prior Publication Data

US 2023/0164995 A1  May 25, 2023

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 43/10; H10B 43/35; H10B 43/40; H10B 43/50; H10B 43/23;
(Continued)

(56) References Cited

U.S. PATENT DOCUMENTS 10,056,399 B2   8/2018  Costa et al.
10,355,015 B2   7/2019  Zhang et al.
(Continued)

FOREIGN PATENT DOCUMENTS

CN          111540752 A       8/2020
KR       102140011872 A       1/2014
WO     WO-2019221792 A1 *  11/2019   ....... H01L 21/76805

OTHER PUBLICATIONS

Three-Dimensional Memory Device Including Inverted Memory Stack Structures and Methods of Making the Same, Cui et. al., Nov. 21, 2019, Translation of: WO 2019221792 (Year: 2019).*

(Continued)

*Primary Examiner* — Cheung Lee
(74) *Attorney, Agent, or Firm* — THE MARBURY LAW GROUP PLLC

(57) ABSTRACT

An alternating stack of insulating layers and spacer material layers is formed over a substrate. An insulating cap layer is formed thereupon. A memory opening is formed, which has a greater lateral dimension at a level of an upper insulating cap sublayer than at a level of a lower insulating cap sublayer. A memory film and a semiconductor channel material layer is formed in the memory opening. Ions of at least one dopant species is implanted into a top portion of the semiconductor channel material layer. An isotropic etch process etches an unimplanted portion of the semiconductor channel material layer at a higher etch rate than the implanted top portion of the semiconductor channel material layer to form a vertical semiconductor channel.

10 Claims, 43 Drawing Sheets

(51) Int. Cl.
*H10B 41/27* (2023.01)
*H10B 41/35* (2023.01)
*H10B 43/10* (2023.01)
*H10B 43/35* (2023.01)

(58) Field of Classification Search
CPC ........ H10B 41/10; H10B 41/27; H10B 41/35; H10B 41/23; H10B 41/50
See application file for complete search history.

(56) References Cited

U.S. PATENT DOCUMENTS

| | | | |
|---|---|---|---|
| 10,685,978 B1 | 6/2020 | Lu et al. | |
| 10,685,979 B1 | 6/2020 | Lu et al. | |
| 10,847,376 B2 | 11/2020 | Osawa et al. | |
| 10,854,513 B2 | 12/2020 | Kawasaki et al. | |
| 11,018,152 B2 | 5/2021 | Hinoue et al. | |
| 11,101,284 B2 | 8/2021 | Pachamuthu et al. | |
| 11,107,829 B2 | 8/2021 | Kwon et al. | |
| 2015/0097222 A1* | 4/2015 | Lee | H10B 41/35 257/314 |
| 2017/0243651 A1* | 8/2017 | Choi | H10B 43/35 |
| 2018/0233513 A1 | 8/2018 | Zhang et al. | |
| 2018/0331117 A1 | 11/2018 | Titus et al. | |
| 2019/0304985 A1* | 10/2019 | Lai | H10B 43/35 |
| 2020/0006080 A1 | 1/2020 | Osawa et al. | |
| 2020/0144426 A1* | 5/2020 | Kwon | H10B 43/27 |
| 2021/0233930 A1* | 7/2021 | Park | H10B 43/40 |
| 2022/0302150 A1* | 9/2022 | Zhang | H10B 43/50 |

OTHER PUBLICATIONS

Notification of Transmittal of The International Search Report and Written Opinion of the International Searching Authority for International Patent Application No. PCT/US2022/029385, mailed Sep. 29, 2022, 10 pages.

Endoh, T. et al., "Novel Ultra High Density Flash Memory with a Stacked-Surrounding Gate Transistor (S-GT) Structured Cell," IEDM Proc., pp. 33-36, (2001).

U.S. Appl. No. 17/136,471, filed Dec. 28, 2020, SanDisk Technologies LLC.

U.S. Appl. No. 17/355,955, filed Jun. 23, 2021, SanDisk Technologies LLC.

U.S. Appl. No. 17/494,114, filed Oct. 5, 2021, SanDisk Technologies LLC.

U.S. Appl. No. 17/508,036, filed Oct. 22, 2021, SanDisk Technologies LLC.

* cited by examiner

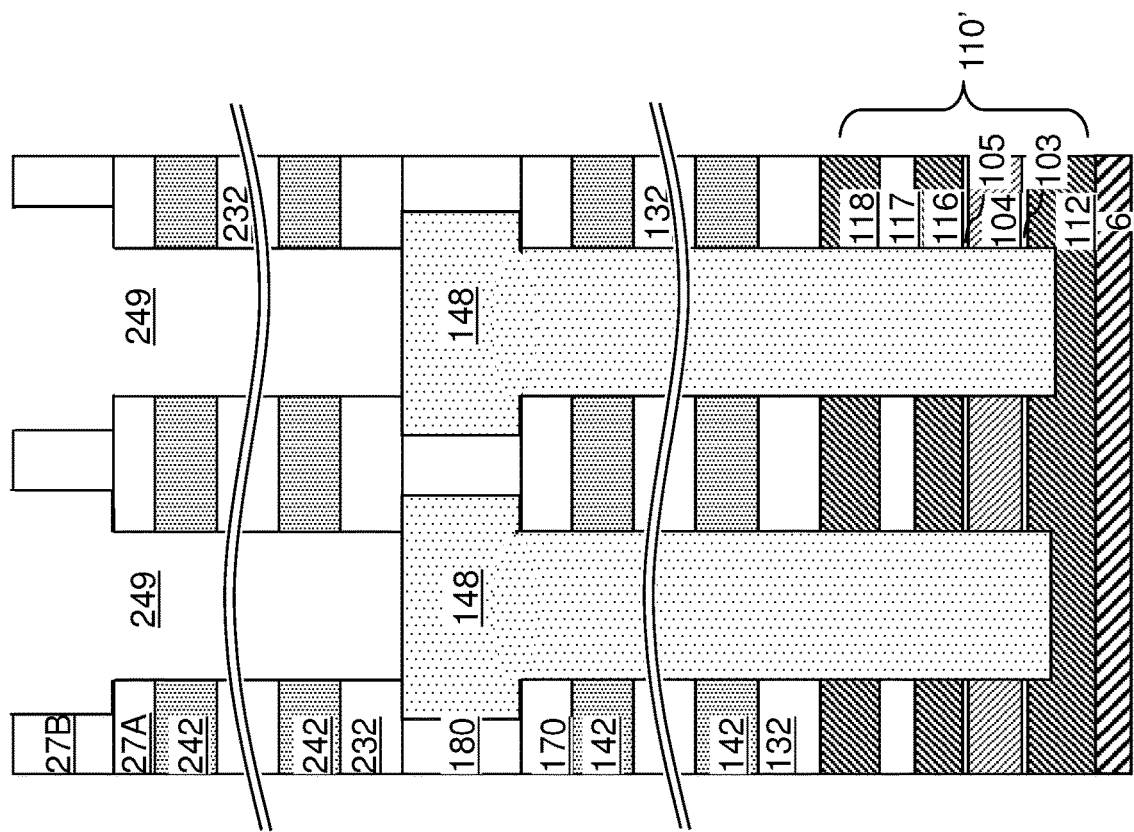

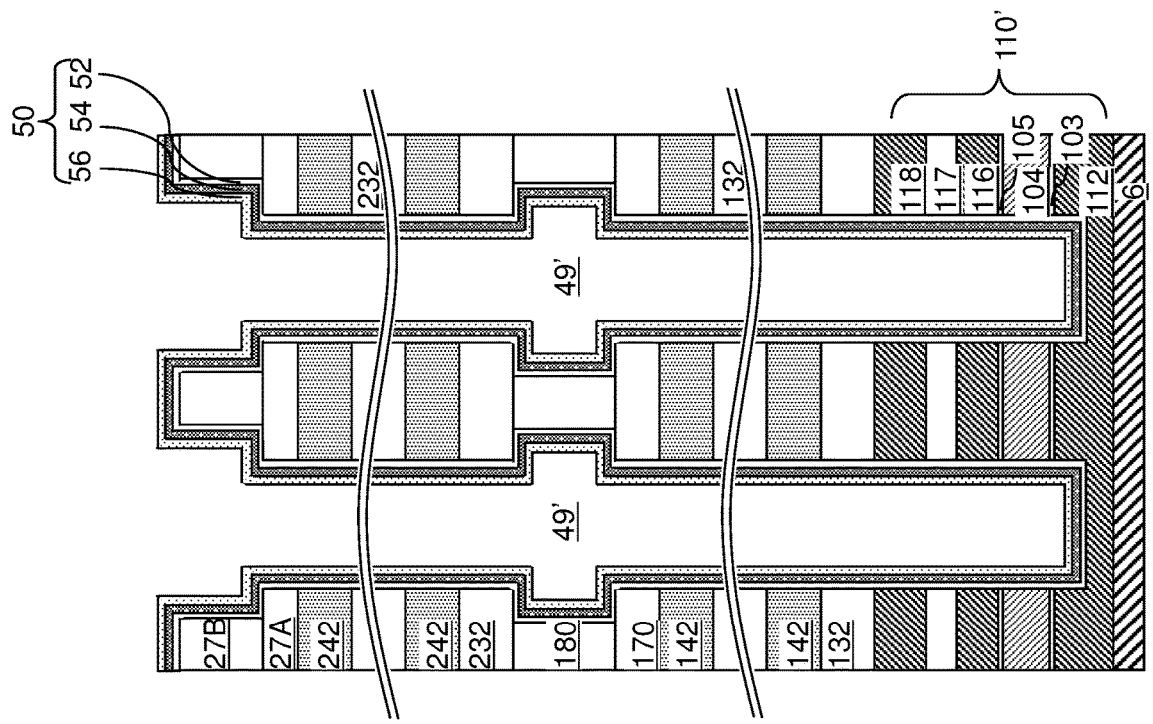
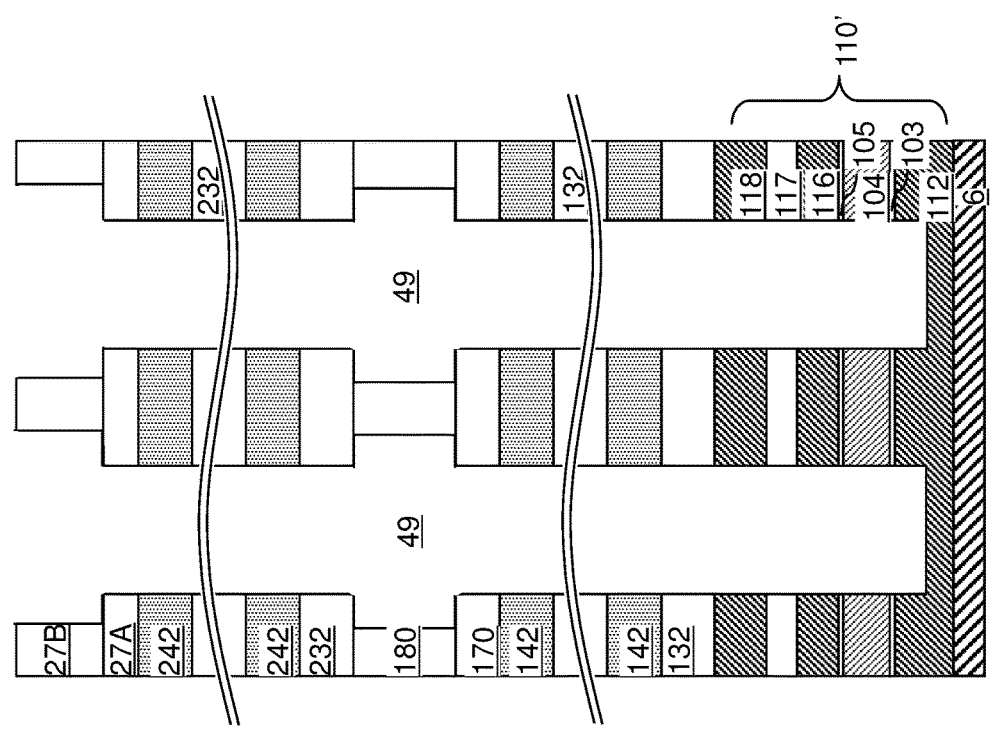

THREE-DIMENSIONAL MEMORY DEVICE AND METHOD OF MAKING THE SAME USING DIFFERENTIAL THINNING OF VERTICAL CHANNELS

FIELD

The present disclosure relates generally to the field of semiconductor devices, and particularly to a three-dimensional memory device including differentially thinned vertical semiconductor channels and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional semiconductor device is provided, which comprises: an alternating stack of insulating layers and electrically conductive layers; an insulating cap layer including a stack of a lower insulating cap sublayer and an upper insulating cap sublayer and overlying the alternating stack; a memory opening vertically extending through the insulating cap layer and the alternating stack, wherein the memory opening has a greater lateral dimension at a level of the upper insulating cap sublayer than at a level of the lower insulating cap sublayer; and a memory opening fill structure located in the memory opening, wherein the memory opening fill structure comprises a memory film and a vertical semiconductor channel that includes a vertically-extending channel portion extending through alternating stack and having a first semiconductor material composition and an annular channel cap portion contacting a top end of the vertically-extending channel portion and having a second semiconductor material composition that differs from the first semiconductor material composition by presence of additional atoms of at least one dopant species.

According to another embodiment of the present disclosure, a method of forming a three-dimensional semiconductor device comprises forming an alternating stack of insulating layers and spacer material layers over a substrate, wherein the spacer material layers are formed as, or are subsequently replaced with, electrically conductive layers; forming an insulating cap layer over the alternating stack, wherein the insulating cap layer comprises a stack of a lower insulating cap sublayer and an upper insulating cap sublayer; forming a memory opening through the insulating cap layer and the alternating stack, wherein the memory opening has a greater lateral dimension at a level of the upper insulating cap sublayer than at a level of the lower insulating cap sublayer and at levels of the insulating layers and the spacer material layers; forming a memory film and a semiconductor channel material layer in the memory opening; implanting ions of at least one dopant species into a top portion of the semiconductor channel material layer; and performing an isotropic etch process that isotropically etches a material of an unimplanted portion of the semiconductor channel material layer at a higher etch rate than a material of the implanted top portion of the semiconductor channel material layer to form a vertical semiconductor channel.

BRIEF DESCRIPTION OF THE DRAWINGS

FIG. 7C is a magnified view of a region of the exemplary structure of FIG. 7A.

FIGS. 9A-9J illustrate sequential vertical cross-sectional views of memory openings during formation of memory opening fill structures according to an embodiment of the present disclosure.

DETAILED DESCRIPTION

Figure 1A:
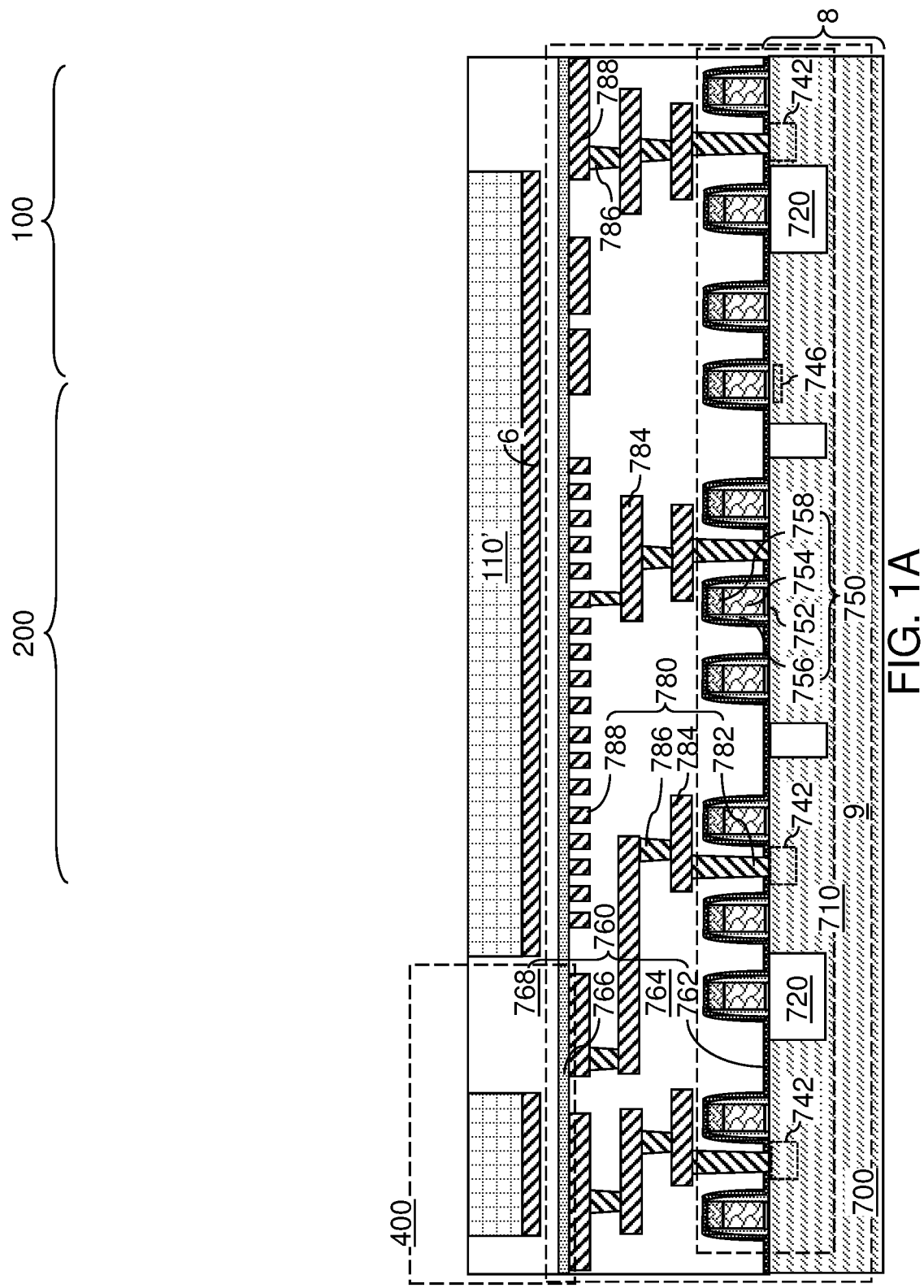
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

As discussed above, the embodiments of the present disclosure provide a three-dimensional memory device and methods of manufacturing the same using differential vertical channel thinning, the various aspects of which are described herein in detail. The embodiments of the present disclosure may be used to form various semiconductor devices, such as three-dimensional memory array devices comprising a plurality of NAND memory strings. The drawings are not drawn to scale.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
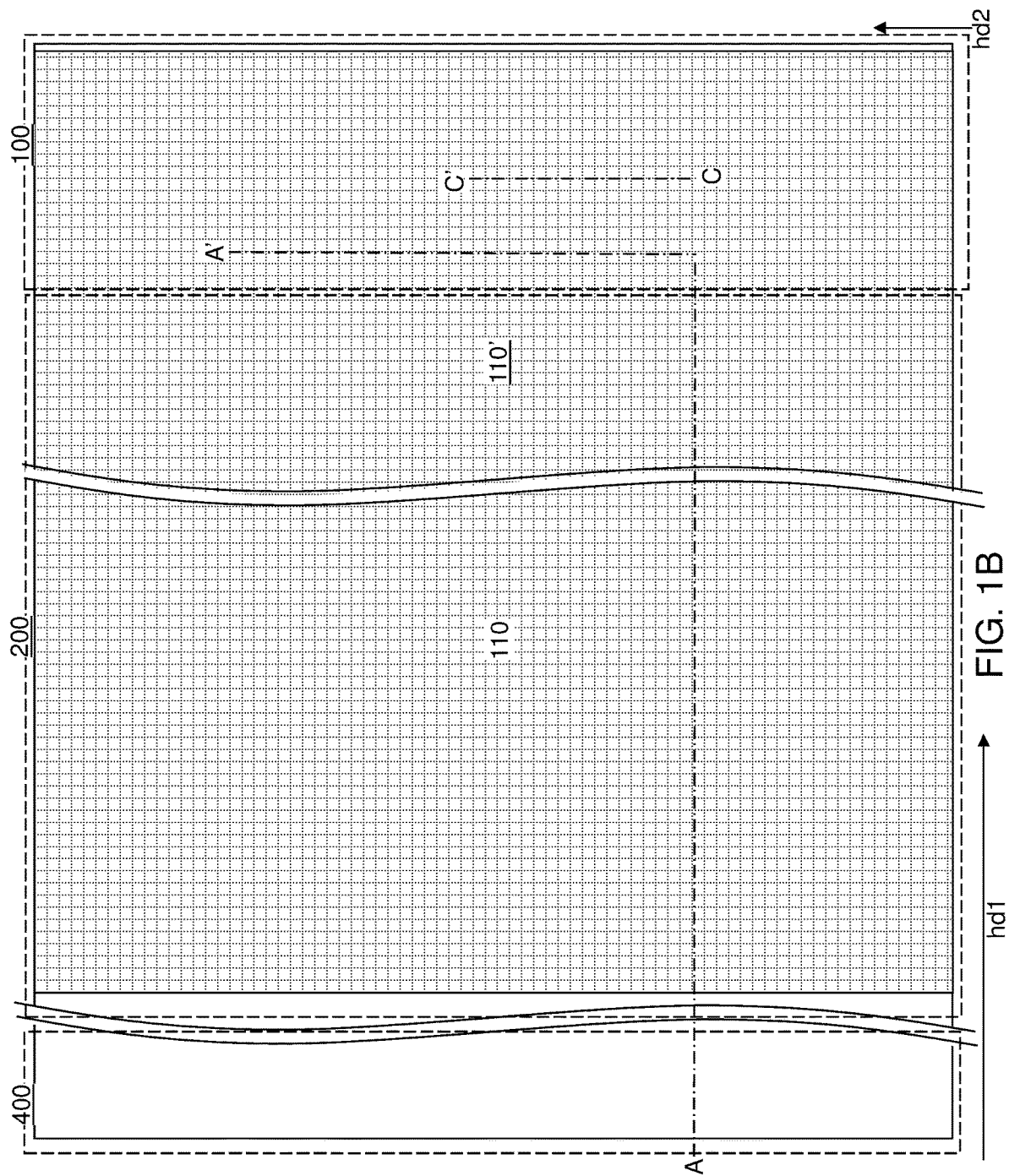
FIG. 1B is a top-down view of the exemplary structure of FIG. 1A. The hinged vertical plane A-A' is the plane of the vertical cross-sectional view of FIG. 1A.
Figure 1C:
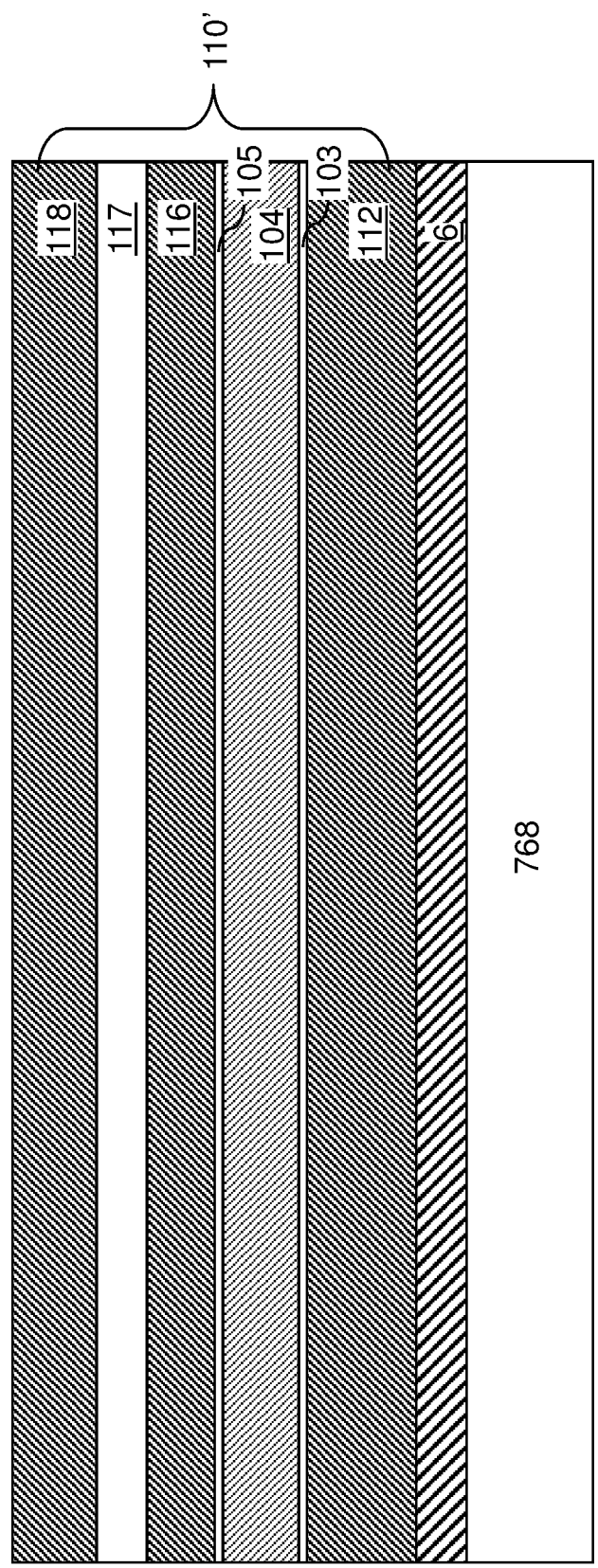
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

In an alternative embodiment, the peripheral device region 700 may be formed on a separate substrate and then bonded to the memory array described below. In another alternative embodiment, the peripheral device region 700 may be formed on the substrate 8 next to (rather than under) the memory array region 100.

Figure 2:
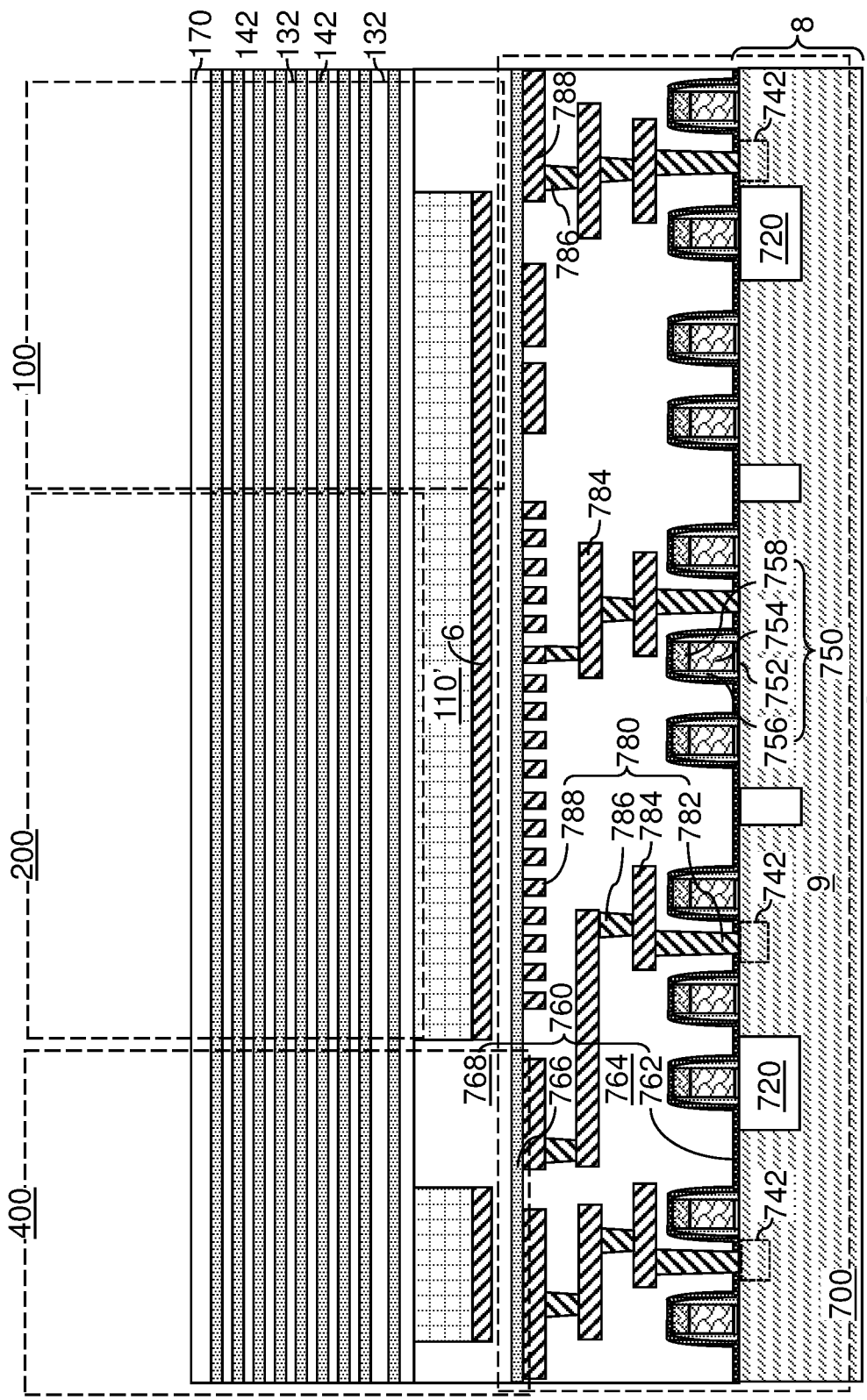
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
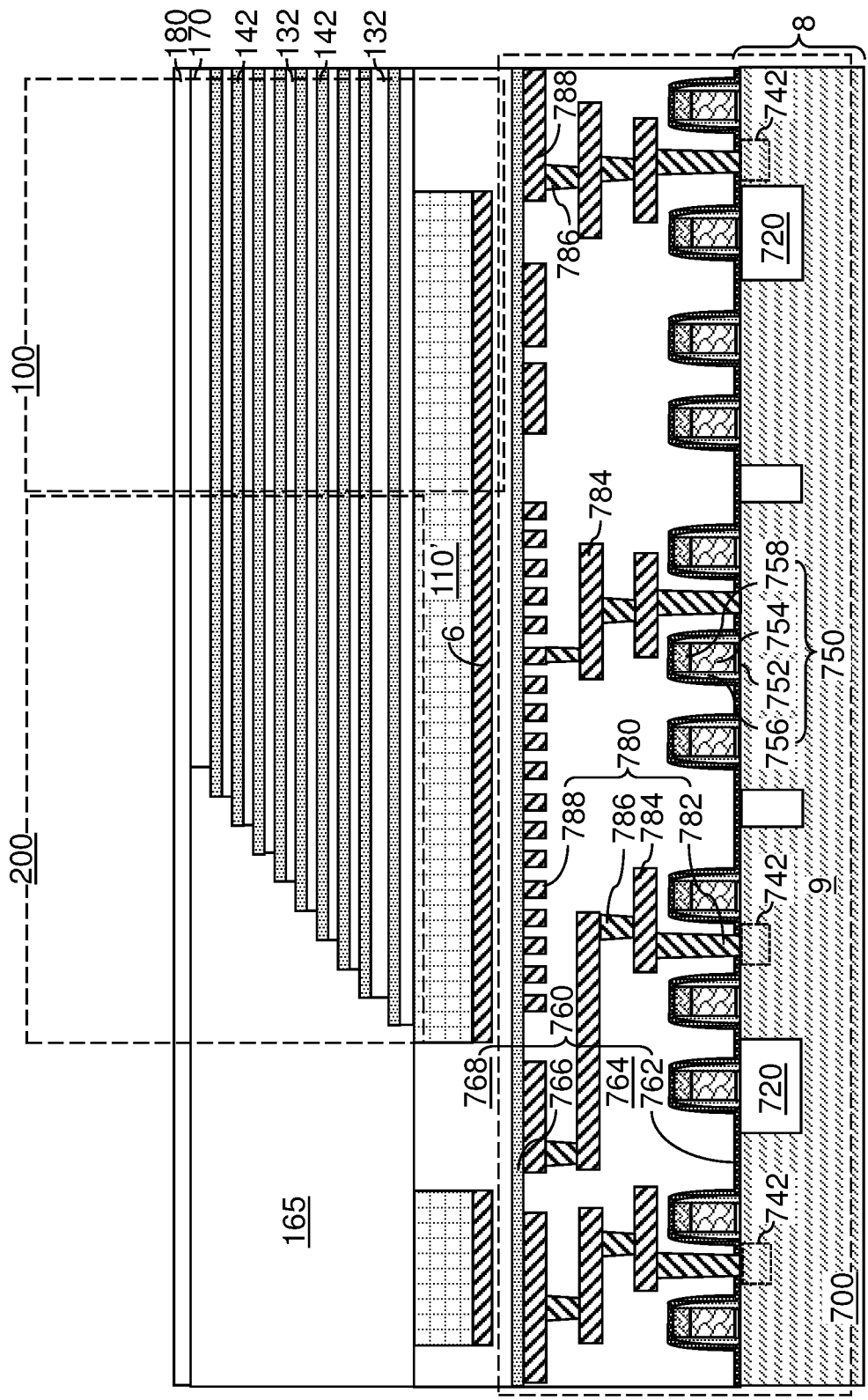
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
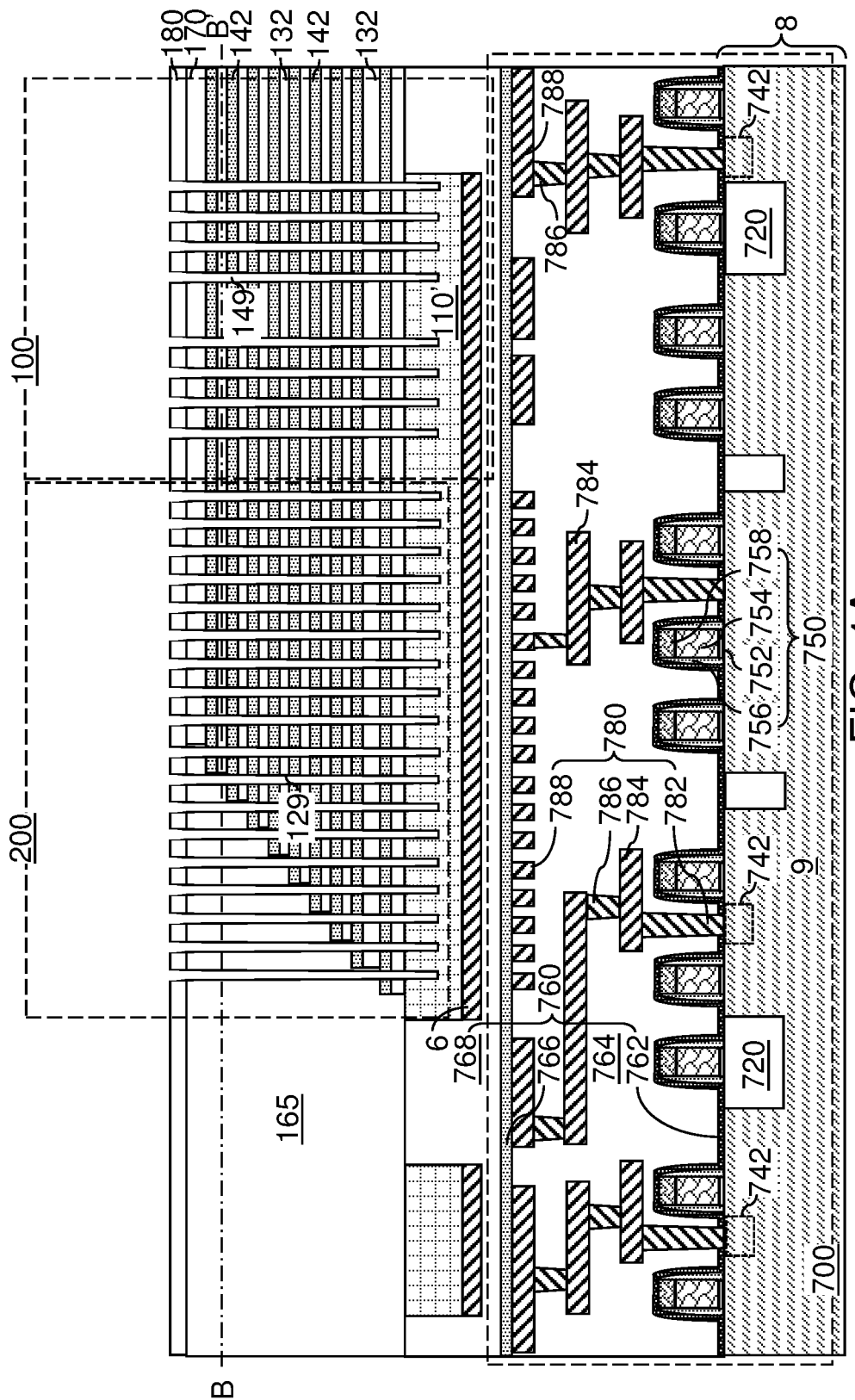
FIG. 4A is a vertical cross-sectional view of the exemplary structure after formation of first-tier memory openings and first-tier support openings according to an embodiment of the present disclosure.
Figure 4B:
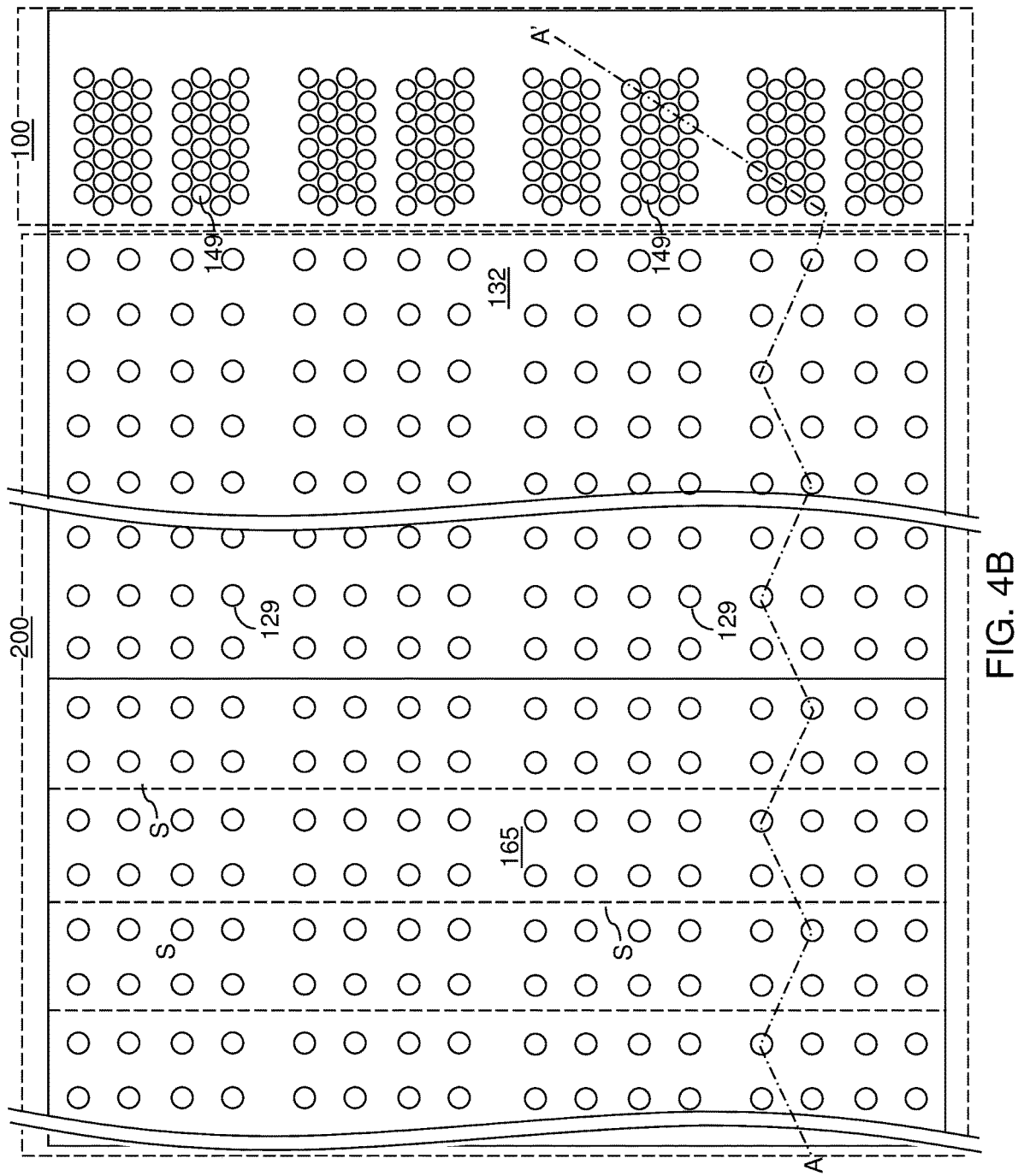
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
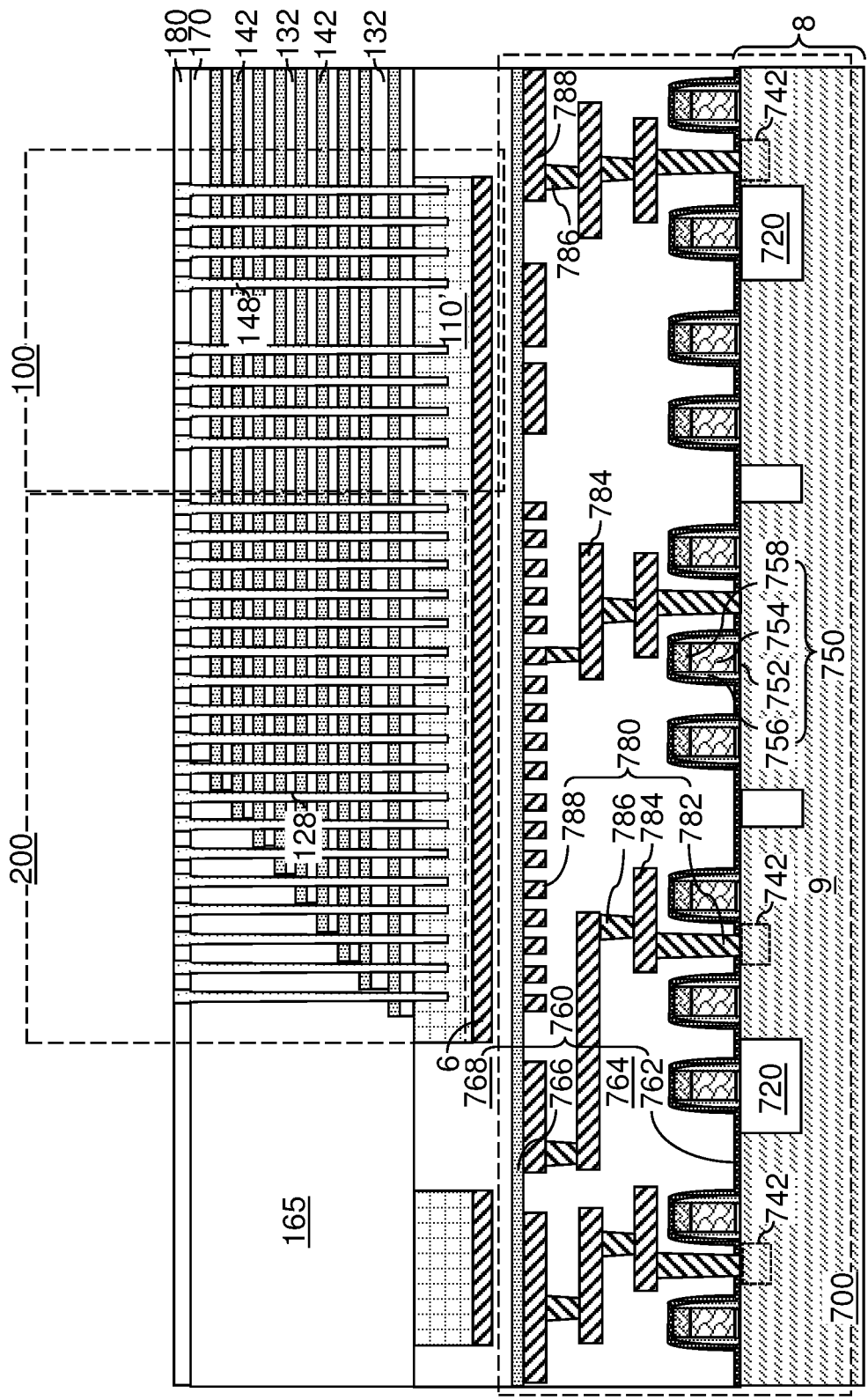
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
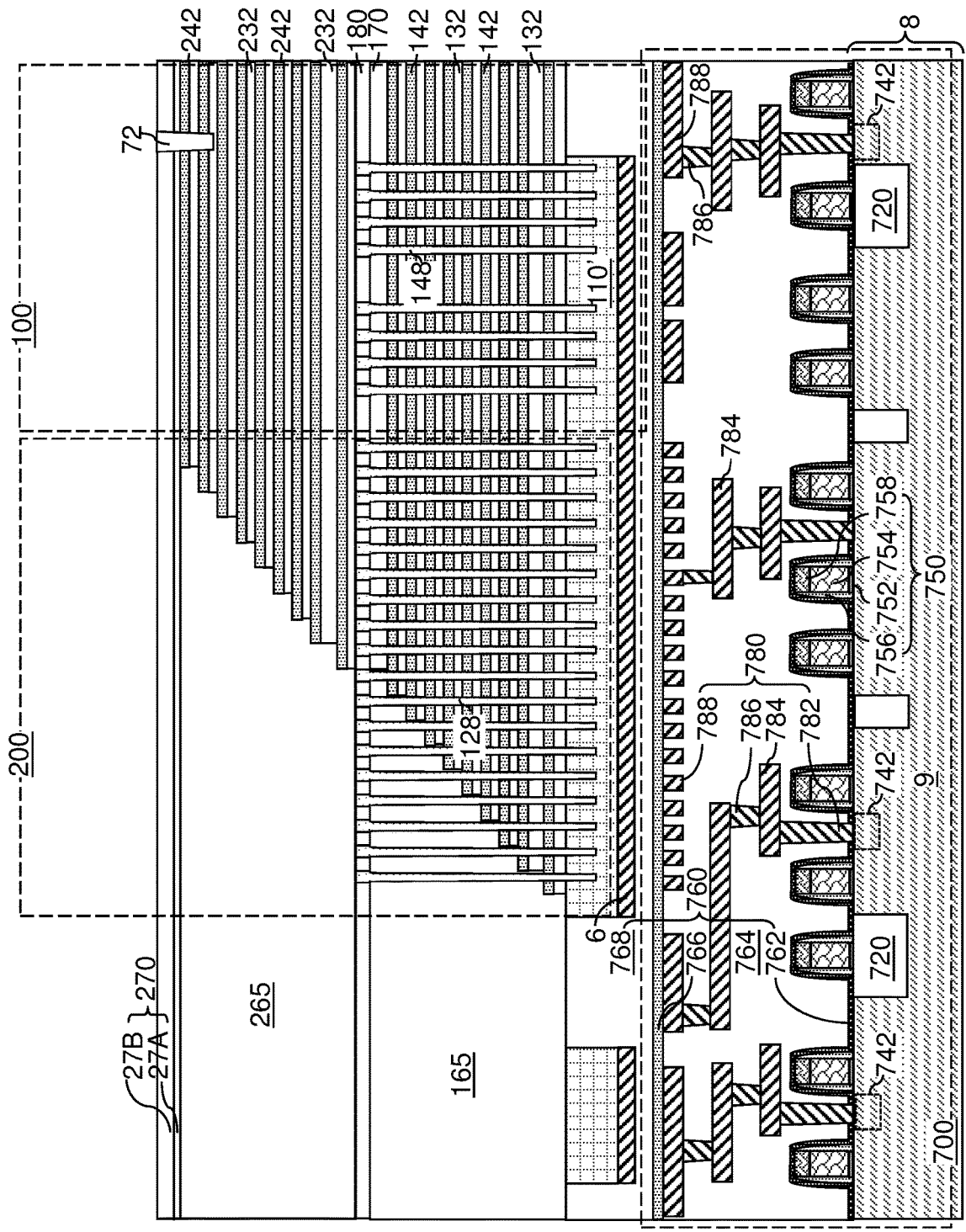
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

While embodiment in which a first-tier alternating stack (132, 142) and a second-tier alternating stack (232, 242) are employed, the embodiments of the present disclosure may be practiced with a single alternating stack or three or more alternating stacks that are vertically stacked. Further, while the present disclosure is described employing an embodiment in which each alternating stack includes sacrificial material layers that are subsequently replaced with electrically conductive layers, embodiments are expressly contemplated herein in which each alternating stack may be formed as a respective alternating stack of insulating layers and electrically conductive layers. In this case, processing steps for replacement of sacrificial material layers with electrically conductive layers can be omitted. Generally, at least one alternating stack of insulating layers (132, 232) and spacer material layers (such as sacrificial material layers (142, 242)) may be formed over a semiconductor material layer (such as a lower source-level semiconductor layer 112 and/or an upper source-level semiconductor layer 116). The spacer material layers may be formed as, or may be subsequently replaced with, electrically conductive layers.

A second insulating cap layer 270 may be subsequently formed over the second alternating stack (232, 242). According to an aspect of the present disclosure, the second including cap layer 27 includes a stack of a lower insulating cap sublayer 27A and an upper insulating cap sublayer 27B. As used herein, a "sublayer" refers to a component layer of a layer stack including two or more component layers. The combination of the lower insulating cap sublayer 27A and the upper insulating cap sublayer 27B constitutes the second insulating cap layer 270.

According to an aspect of the present disclosure, the lower insulating cap sublayer 27A comprises a first dielectric material and the upper insulating cap sublayer 27B comprises a second dielectric material. The first dielectric material and the second dielectric material are selected such that an etch chemistry exists that etches the second dielectric material at a faster etch rate than the first dielectric material by a factor of at least two. The etch chemistry may be provided in an anisotropic etch process or in an isotropic etch process.

In one embodiment, the lower insulating cap sublayer 27A comprises, and/or consists essentially of, a first silicon oxide material having a first etch rate in 100:1 dilute hydrofluoric acid at room temperature, and the upper insulating cap sublayer 27B comprises, and/or consists essentially of, a second silicon oxide material having a second, higher etch rate in 100:1 dilute hydrofluoric acid at room temperature. The first silicon oxide material and the second silicon oxide material can be selected such that the ratio of the second etch rate to the first etch rate is in a range from 2 to 10,000, such as from 10 to 1,000. In other words, the upper insulating cap sublayer 27B has an etch rate which is 2 to 10,000 times, such as 10 to 1,000 times, for example 10 to 100 times higher than the lower insulating cap sublayer 27A. For example, the lower insulating cap sublayer 27A may comprise a denser silicon oxide sublayer than the upper insulating cap sublayer 27B. For example, the lower insulating cap sublayer 27A may comprise a densified undoped silicon oxide formed from a TEOS source (e.g., a dTEOS silicon dioxide sublayer), while the upper insulating cap sublayer 27B may comprise an undensified undoped silicon oxide sublayer formed by low pressure chemical vapor deposition (LPCVD) from the TEOS source. Alternatively, the lower insulating cap sublayer 27A may comprise an undoped silicon oxide sublayer, while the upper insulating cap sublayer 27B may comprise a doped silicon oxide sublayer, such as borosilicate glass, phosphosilicate glass, borophosphosilicate glass, fluorosilicate glass, or organosilicate glass.

The thickness of the lower insulating cap sublayer 27A may be in a range from 50 nm to 150 nm, such as from 75 nm to 100 nm, although lesser and greater thicknesses may also be employed. The thickness of the upper insulating cap sublayer 27B may be in a range from 50 nm to 150 nm, such as from 75 nm to 100 nm, although lesser and greater thicknesses may also be employed.

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
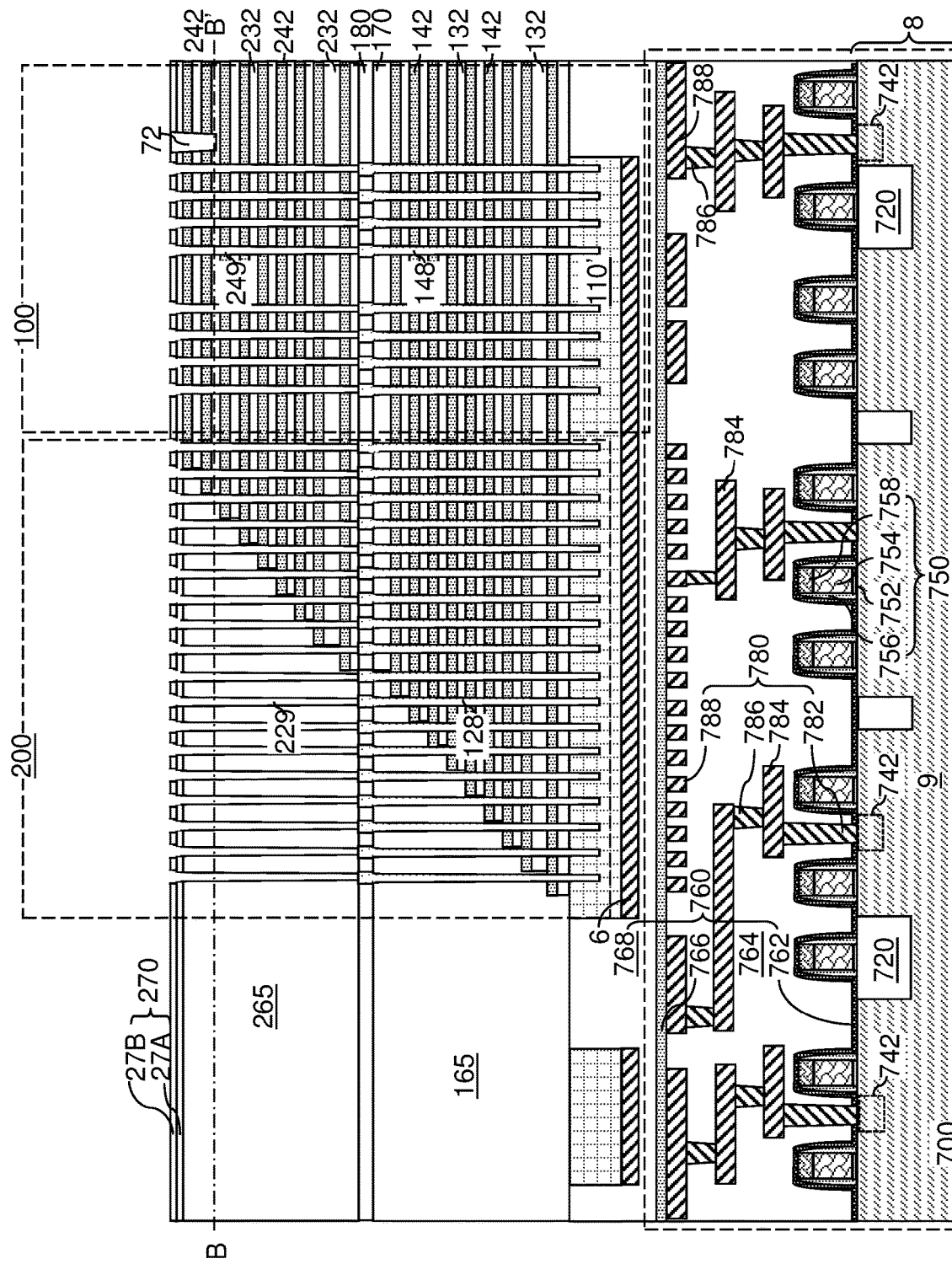
FIG. 7A is a vertical cross-sectional view of the exemplary structure after formation of second-tier memory openings and second-tier support openings according to an embodiment of the present disclosure.
Figure 7B:
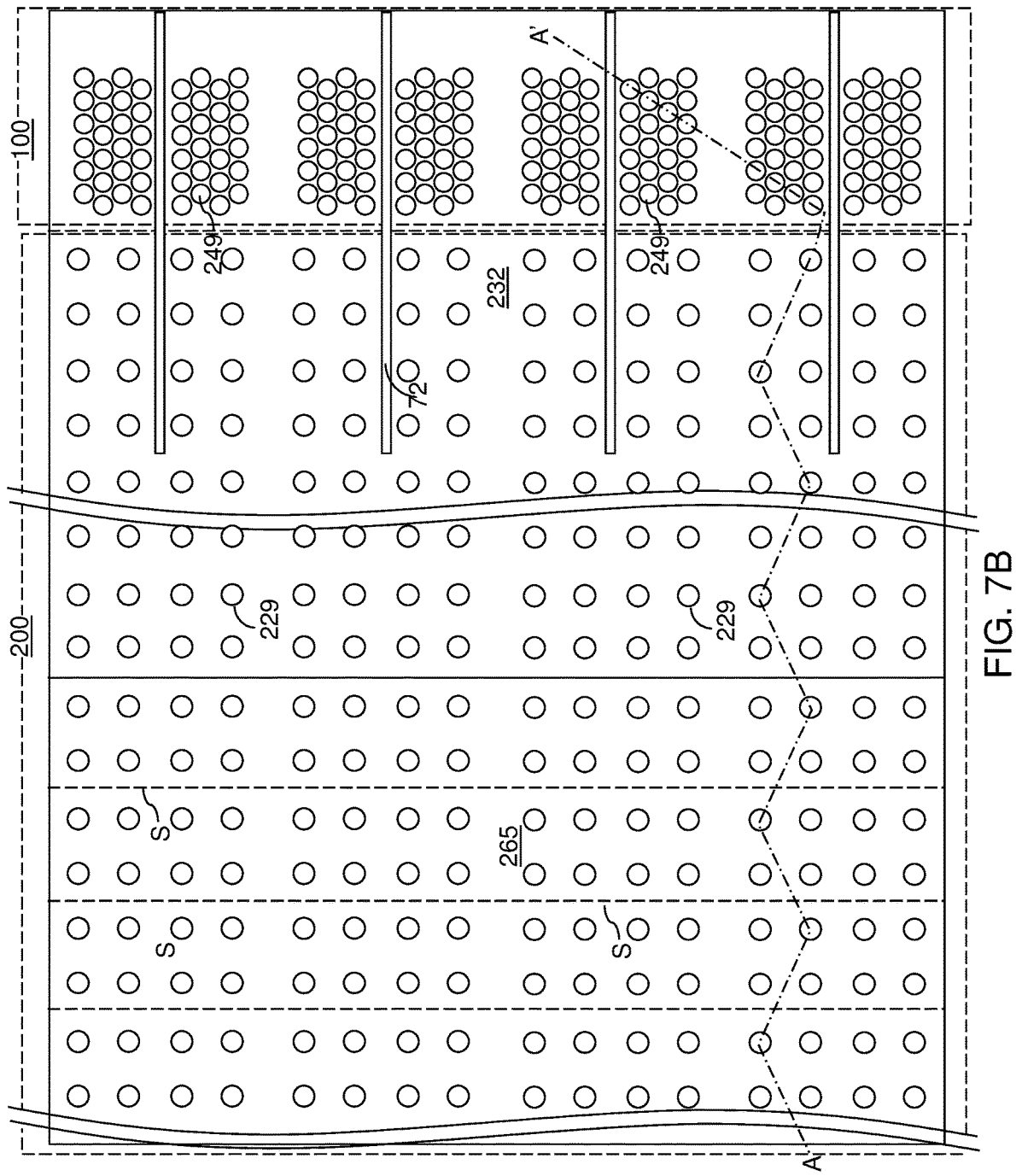
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A-7C, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

According to an aspect of the present disclosure, the second-tier openings (249, 229) can be formed through the insulating cap layer 270 and the second-tier alternating stack (232, 242) such that each of the second-tier openings (249, 229) has a greater lateral dimension at a level of the upper insulating cap sublayer 27B than at a level of the lower insulating cap sublayer 27A and at levels of the second-tier insulating layers 232 and the spacer material layers of the second-tier alternating stack (such as the second-tier sacrificial material layers 242).

In one embodiment shown in FIG. 7C, the greater lateral extent of the second-tier openings (249, 229) at the level of the upper insulating cap sublayer 27B than at the levels of the lower insulating cap sublayer 27A and the second-tier alternating stack (232, 242) can be provided by differential collateral etch rates of the material of the upper insulating cap sublayer 27B and the lower insulating cap sublayer 27A during the anisotropic etch process that forms the second-tier openings (249, 229). In one embodiment, the second-tier openings (249, 229) can be provided by forming a patterned etch mask layer (such as a patterned photoresist layer) over the insulating cap layer 270, and by performing the second anisotropic etch process that transfers the pattern of openings in the patterned etch mask layer through the insulating cap layer 270 and the second-tier alternating stack. In this case, the second anisotropic etch process may collaterally recesses a sidewall surface of the upper insulating cap sublayer 27B at a higher etch rate than a sidewall surface of the lower insulating cap sublayer 27A around each second-tier opening (249, 229).

In another embodiment, the greater lateral extent of the second-tier openings (249, 229) at the level of the upper insulating cap sublayer 27B than at the levels of the lower insulating cap sublayer 27A and the second-tier alternating stack (232, 242) can be provided by differential collateral etch rates of the material of the upper insulating cap sublayer 27B and the lower insulating cap sublayer 27A during an isotropic etch process that is performed after the anisotropic etch process that forms the second-tier openings (249, 229). In one embodiment, the second-tier openings (249, 229) can be provided by forming a patterned etch mask layer over the insulating cap layer and by performing an anisotropic etch process that transfers a pattern of an opening in the patterned etch mask layer through the insulating cap layer and the alternating stack, and by subsequently performing an isotropic etch process that etches the material of the upper insulating cap sublayer 27B. In this case, the isotropic etch process etches the material of the upper insulating cap sublayer at a higher etch rate than the material of the lower insulating cap sublayer 27A. In one embodiment, the isotropic etch process may comprise a wet etch process employing dilute hydrofluoric acid (such as 100:1 dilute hydrofluoric acid or a dilute hydrofluoric acid having a different dilution).

Generally, the physically exposed sidewalls of the upper insulating cap sublayer 27B may be vertical or substantially vertical, or may be tapered. In one embodiment, the physically exposed sidewalls of the upper insulating cap sublayer 27B may be vertical or substantially vertical, and may be laterally offset outward from an underlying physically exposed sidewall of the lower insulating cap sublayer 27A. Alternatively, the physically exposed sidewalls of the upper insulating cap sublayer 27B may be tapered, and may be adjoined to a top periphery of an underlying physically exposed sidewall of the lower insulating cap sublayer 27A or may be laterally offset outward from an underlying physically exposed sidewall of the lower insulating cap sublayer 27A.

Figure 8:
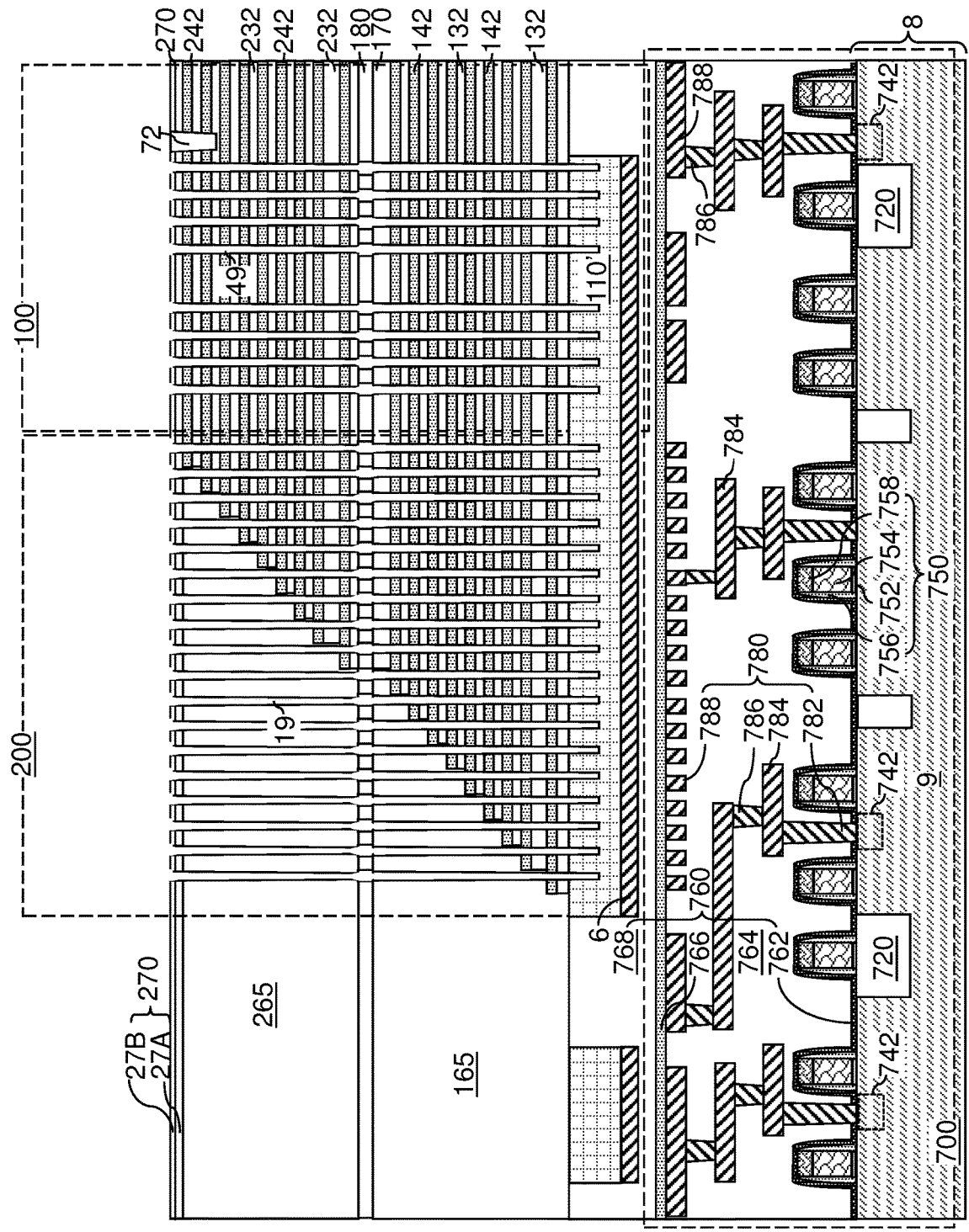
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9J provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. Each memory opening 49 of the exemplary structure extends through the insulating cap layer 270 and the alternating stacks of the second-tier structure and the first-tier structure. In one embodiment, each memory opening 49 has a greater lateral dimension at a level of the upper insulating cap sublayer 27B than at a level of the lower insulating cap sublayer 27A and at levels of the insulating layers (132, 232) and the spacer material layers (such as the sacrificial material layers (142, 242)).

Referring to FIG. 9B, a stack of layers including a blocking dielectric layer 52, a memory material layer 54, and a tunneling dielectric layer 56 may be sequentially deposited in the memory openings 49. The stack of layers constitutes a memory film 50, which includes memory material portions (such as portions of the memory material layer 54) at levels of the spacer material layers (such as the sacrificial material layers (142, 242)).

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the memory material layer 54 may be formed. The memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store date by altering electrical resistivity.

In one embodiment, the memory material layer 54 may be a continuous layer or patterned discrete portions of a charge trapping material including a dielectric charge trapping material, which may be, for example, silicon nitride. Alternatively, the memory material layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the memory material layer 54 includes a silicon nitride layer. In one embodiment, the sacrificial material layers (142, 242) and the insulating layers (132, 232) may have vertically coincident sidewalls, and the memory material layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the memory material layer 54 as a plurality of memory material portions that are vertically spaced apart. The thickness of the memory material layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the memory material layer 54, and the tunneling dielectric layer 56 constitutes a memory film 50 that stores memory bits. Alternatively, the tunneling dielectric layer 56 may be omitted if a ferroelectric memory material layer 54 is used.

Figure 9D:
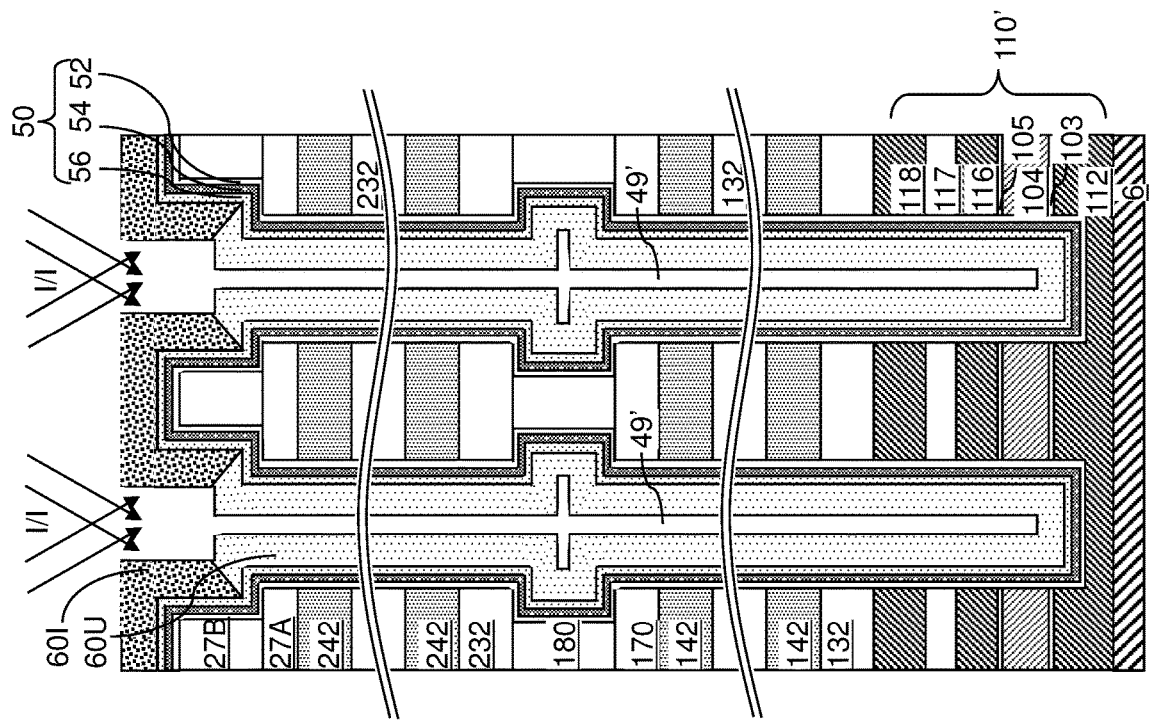
Figure 9C:
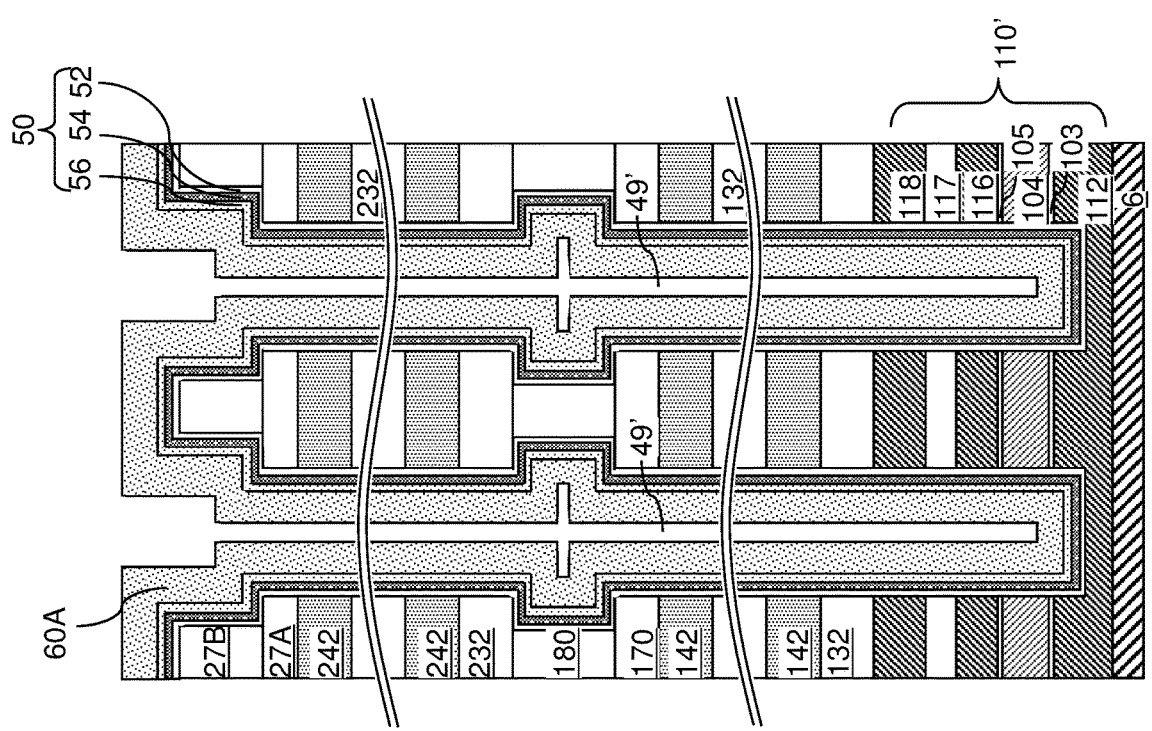

Referring to FIG. 9C, an amorphous semiconductor material can be conformally deposited over the memory film 50 to form an amorphous semiconductor channel material layer 60A. The amorphous semiconductor channel material layer 60A includes an amorphous p-doped semiconductor material, which may include at least one elemental semiconductor material, at least one III-V compound semiconductor material, at least one II-VI compound semiconductor material, at least one organic semiconductor material, or other semiconductor materials known in the art. In one embodiment, the amorphous semiconductor channel material layer 60A may having a uniform doping. In one embodiment, the amorphous semiconductor channel material layer 60A has a p-type doping in which p-type dopants (such as boron atoms) are present at an atomic concentration in a range from $1.0 \times 10^{12}/cm^3$ to $1.0 \times 10^{17}/cm^3$, such as from $1.0 \times 10^{14}/cm^3$ to $1.0 \times 10^{16}/cm^3$. In one embodiment, the amorphous semiconductor channel material layer 60A includes, and/or consists essentially of, boron-doped amorphous silicon or boron-doped polysilicon. In another embodiment, the amorphous semiconductor channel material layer 60A has an n-type doping in which n-type dopants (such as phosphor atoms or arsenic atoms) are present at an atomic concentration in a range from $1.0 \times 10^{12}/cm^3$ to $1.0 \times 10^{17}/cm^3$, such as from $1.0 \times 10^{14}/cm^3$ to $1.0 \times 10^{16}/cm^3$. The amorphous semiconductor channel material layer 60A may be formed by a conformal deposition method such as low pressure chemical vapor deposition (LPCVD). The thickness of the amorphous semiconductor channel material layer 60A may be uniform or substantially uniform throughout. In one embodiment, the thickness of the amorphous semiconductor channel material layer 60A may be in a range from 15 nm to 100 nm, such as from 20 nm to 50 nm, although lesser and greater thicknesses may also be used. A cavity 49' is formed in the volume of each memory opening 49 that is not filled with the deposited material layers (52, 54, 56, 60A).

Referring to FIG. 9D, ions of at least one dopant species can be implanted into a top portion of the amorphous semiconductor channel material layer 60A by an ion implantation process, such as an angled ion implantation process. The implanted portions of the amorphous semiconductor channel material layer 60A is herein referred to as an implanted amorphous semiconductor channel material layer 60I. Each unimplanted portion of the amorphous semiconductor channel material layer 60A is herein referred to as an unimplanted amorphous channel material portion 60U.

The at least one dopant species comprises an element that can reduce the etch rate of the semiconductor material of the amorphous semiconductor channel material layer 60A (such as silicon or a silicon germanium alloy) upon incorporation therein. For example, the at least one dopant species comprises a species selected from boron and/or argon. Generally, heavily boron-doped semiconductor materials (such as boron-doped amorphous silicon and heavily argon-doped semiconductor materials (such as argon-doped amorphous silicon) can have a lower etch rate in an isotropic etchant than lightly doped semiconductor materials, such as the intrinsic or lightly doped amorphous silicon material of the unimplanted portions 60U of the amorphous semiconductor channel material layer 60A. For example, if the unimplanted portions 60U of the amorphous silicon channel material layer 60A comprise boron-doped amorphous silicon including boron atoms at an atomic concentration in a range from $1.0 \times 10^{12}/cm^3$ to $1.0 \times 10^{17}/cm^3$, such as from $1.0 \times 10^{14}/cm^3$ to $1.0 \times 10^{16}/cm^3$, and if the implanted portions 60I of the amorphous silicon channel material layer 60A include boron atoms and/or argon atoms at an atomic concentration of at least $1.0 \times 10^{18}/cm^3$, such as $1.0 \times 10^{18}/cm^3$ to 5 atomic %, then the etch rate of the implanted portions 60I of the amorphous silicon channel material layer 60A in tetramethylammonium hydroxide (TMAH) or hot trimethyl-2 hydroxyethyl ammonium hydroxide ("hot TMY") may be less than the etch rate of the unimplanted portion 60U of the amorphous semiconductor channel material layer 60A by a factor in a range from 3 to 10,000, such as from 10 to 1,000.

The tilt angle and the implantation energy of the ion implantation process can be selected such that the implanted amorphous semiconductor channel material layer 60I is formed above the horizontal plane including the interface between the lower insulating cap sublayer 27A and the upper insulating cap sublayer 27B. The dose of the tilted ion implantation process can be selected such that the implanted amorphous semiconductor channel material layer 60I includes atoms of the at least one implanted species at an atomic concentration of at least $1.0 \times 10^{18}/cm^3$. The combination of the implanted amorphous semiconductor channel material layer 60I and all of the unimplanted amorphous channel material portions 60U constitutes an amorphous semiconductor channel material layer (60U, 60I).

Figure 9F:
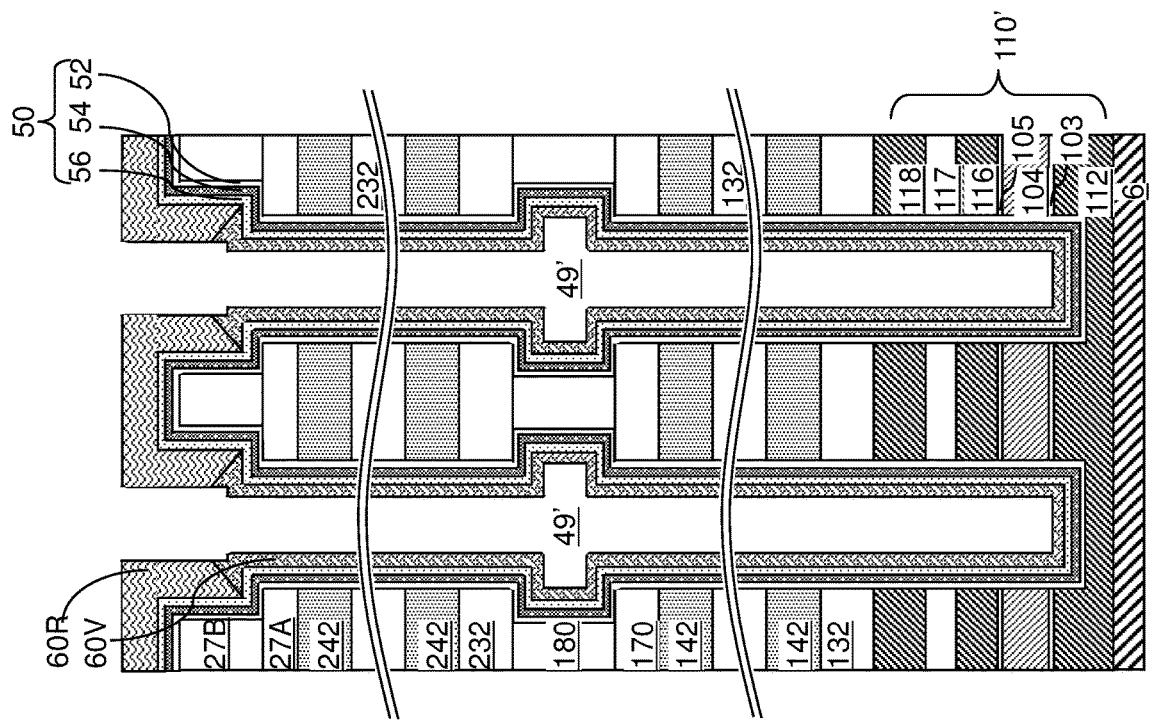
Figure 9E:
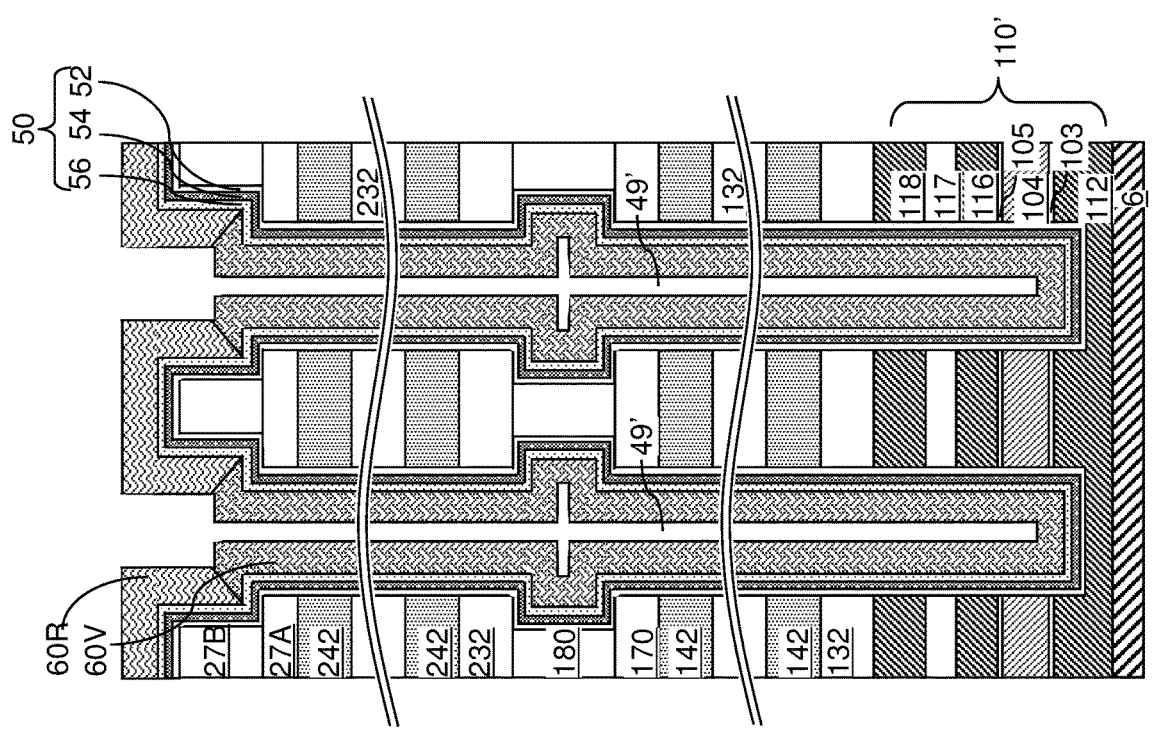

Referring to FIG. 9E, a thermal anneal process can be performed to crystallize the unimplanted amorphous channel material portion 60U and the implanted amorphous semiconductor channel material layer 60I. The elevated temperature of the thermal anneal process may be in a range from 600 degrees Celsius to 1,050 degrees Celsius, such as from 650 degrees Celsius to 900 degrees Celsius. The unimplanted amorphous channel material portion 60U is converted into a vertically-extending channel portion 60V, and the implanted amorphous semiconductor channel material layer 60I is converted into an etch-retardant-doped semiconductor channel material layer 60R. Alternatively, the crystallization anneal may be conducted after forming the drain region 63 in the step shown in FIG. 9J.

Referring to FIG. 9F, an isotropic etch process can be performed, which isotropically etches the material of the vertically-extending channel portion 60V (which is a crystallized unimplanted portion of the amorphous semiconductor channel material layer as formed at the processing step of FIG. 9C) at a higher etch rate than the material of the etch-retardant-doped semiconductor channel material layer 60R (which is a crystalized implanted top portion of the amorphous semiconductor channel material layer as formed at the processing step of FIG. 9C).

In one embodiment, the vertically-extending channel portion 60V comprises, and/or consists essentially of, boron-doped polysilicon or a boron-doped silicon-germanium alloy including boron atoms at an atomic concentration in a range from $1.0 \times 10^{12}/cm^3$ to $1.0 \times 10^{17}/cm^3$, such as from $1.0 \times 10^{14}/cm^3$ to $1.0 \times 10^{16}/cm^3$, and the etch-retardant-doped semiconductor channel material layer 60R may have a material composition that differs from the material composition of the vertically-extending channel portion 60V only by the addition of the atoms of the at least one species selected from boron and argon. In one embodiment, the etch-retardant-doped semiconductor channel material layer 60R includes atoms of the at least one implanted species at an atomic concentration of at least $1.0 \times 10^{18}/cm^3$, such as an average atomic percentage in a range from 0.1% to 5%. In this case, the isotropic etch process may comprise a wet etch process employing TMAH or TMY.

The duration of the isotropic etch process can be selected such that the vertically-extending channel portion 60V located below the horizontal plane including an interface between the lower insulating cap sublayer 27A and the upper insulating cap sublayer 27B are made thinner, and may have a thickness in a range from 2 nm to 10 nm, such as from 3 nm to 8 nm. In one embodiment, the entirety of the vertically-extending channel portion 60V may have a uniform thickness throughout. The thickness of the etch-retardant-doped semiconductor channel material layer 60R after the isotropic etch process may be greater than the thickness of the vertically-extending channel portion 60V. The thickness of the etch-retardant-doped semiconductor channel material layer 60R after the isotropic etch process may be in a range from 15 nm to 100 nm, such as from 20 nm to 50 nm, although lesser and greater thicknesses may also be used. Generally, the ratio of the thickness of the etch-retardant-doped semiconductor channel material layer 60R to the thickness of the vertically-extending channel portion 60V may be in a range from 1.5 to 20, such as from 2 to 10, although lesser and greater ratios may also be employed.

Figure 9H:
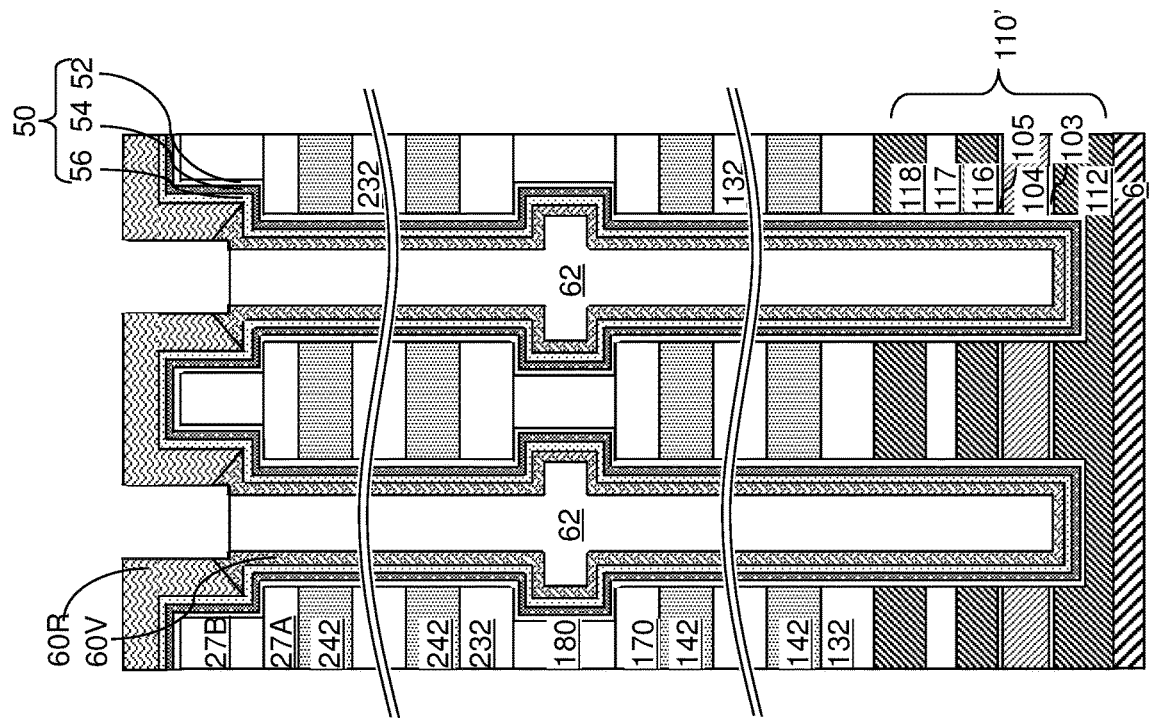
Figure 9G:
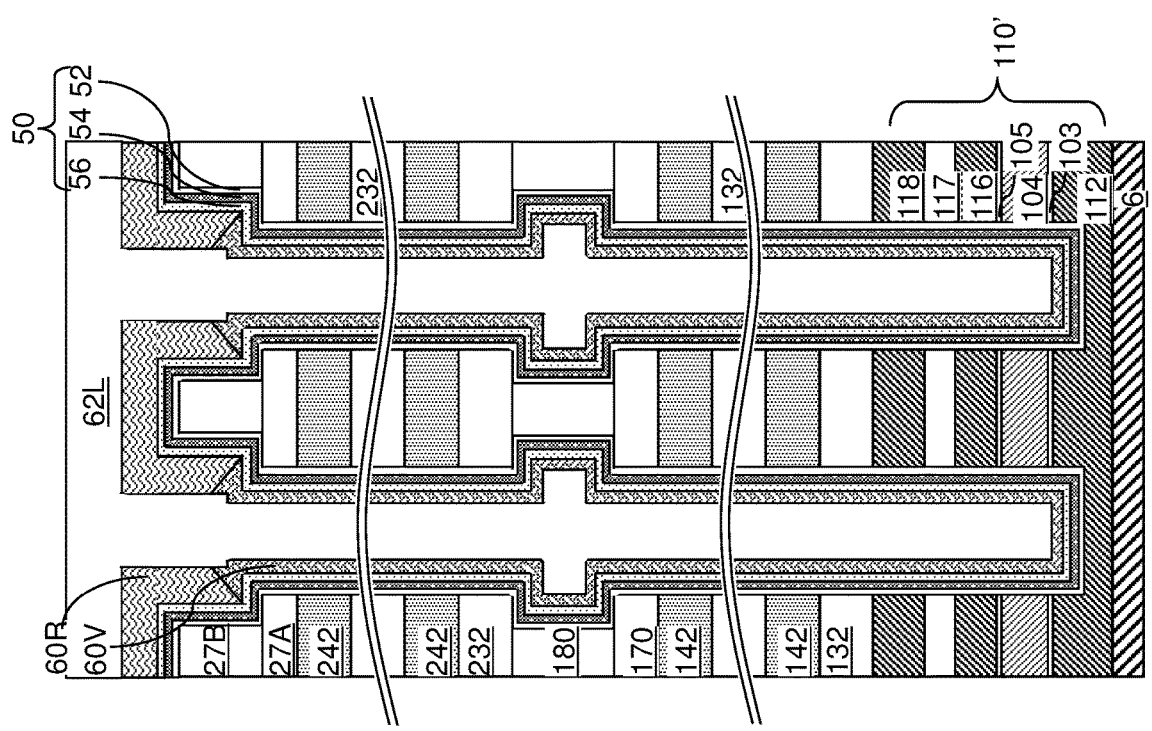

Referring to FIG. 9G, a dielectric fill material may be deposited in the cavity within each memory opening 49 and over the etch-retardant-doped semiconductor channel material layer 60R to form a dielectric core layer 62L. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 9H, the horizontal portion of the dielectric core layer 62L overlying the second insulating cap layer 270 may be removed, for example, by a recess etch. The recess etch may be continued until surfaces of the vertically-extending channel portion 60V are physically exposed. Each remaining portion of the dielectric core layer constitutes a dielectric core 62. Generally, a dielectric core 62 can be formed on an inner sidewall of each vertically-extending channel portion 60V.

Figure 9J:
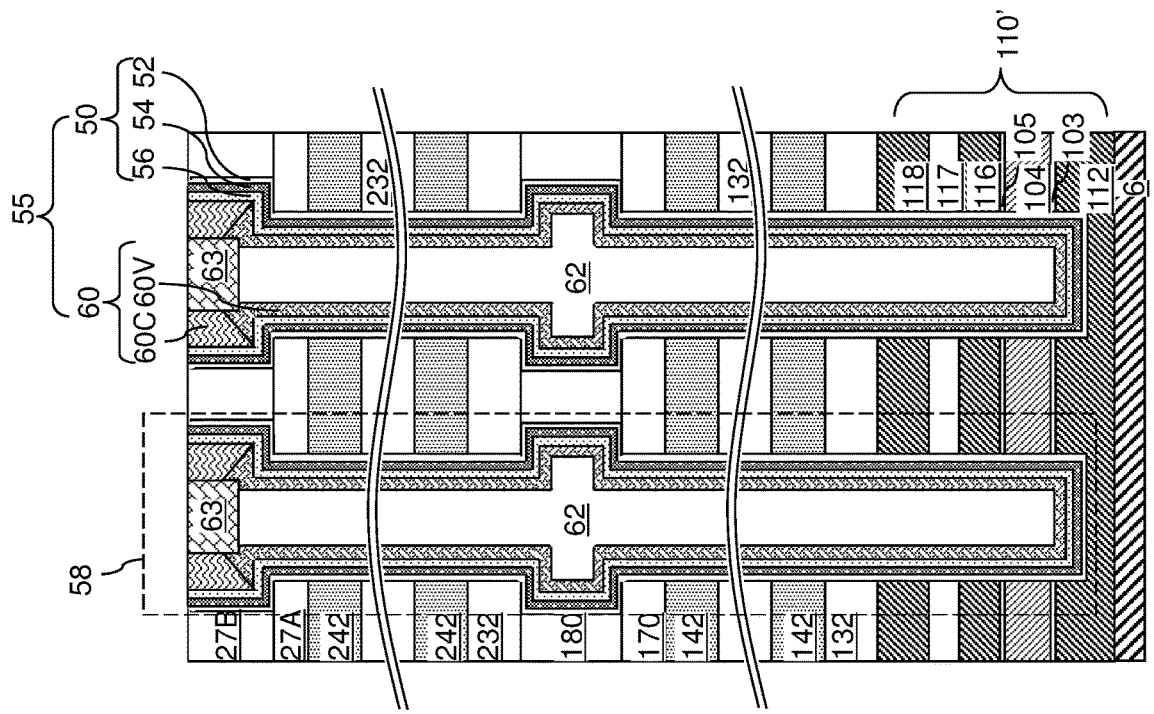
Figure 9I:
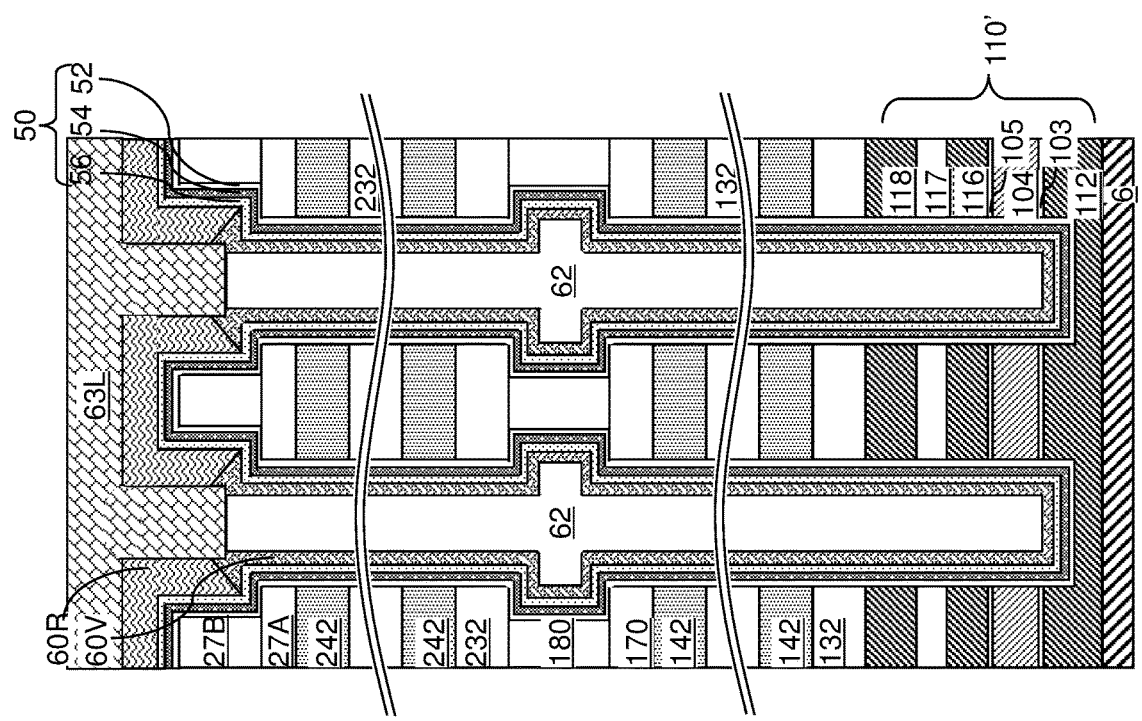

Referring to FIG. 9I, a drain-side doped semiconductor material layer 63L having a doping of a second conductivity type may be deposited in cavities overlying the dielectric cores 62 and the etch-retardant-doped semiconductor channel material layer 60R. The second conductivity type is the opposite of the first conductivity type. For example, if the first conductivity type is p-type, the second conductivity type is n-type, and vice versa. The drain-side doped semiconductor material may comprise in-situ doped amorphous silicon or polysilicon, or it may comprise intrinsic amorphous silicon or polysilicon which is subsequently doped by ion implantation after deposition.

Referring to FIG. 9J, portions of the drain-side doped semiconductor material layer 63L, the etch-retardant-doped semiconductor channel material layer 60R, the tunneling dielectric layer 56, the memory material layer 54, and the blocking dielectric layer 52 that overlie the horizontal plane including the top surface of the second insulating cap layer 270 may be removed by a planarization process such as a recess etch process and/or a chemical mechanical planarization (CMP) process.

Each remaining portion of the drain-side doped semiconductor material layer 63L of the second conductivity type constitutes a drain region 63. The dopant concentration in the drain regions 63 may be in a range from $5.0 \times 10^{18}/\text{cm}^3$ to $2.0 \times 10^{21}/\text{cm}^3$, although lesser and greater dopant concentrations may also be used.

Each remaining portion of the etch-retardant-doped semiconductor channel material layer 60R constitutes an annular channel cap portion 60C. Each combination of a vertically-extending channel portion 60V and an annular channel cap portion 60C constitutes a vertical semiconductor channel 60V. A tunneling dielectric layer 56 is surrounded by a memory material layer 54, and laterally surrounds a vertical semiconductor channel 60. Each adjoining set of a blocking dielectric layer 52, a memory material layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Generally, a vertical semiconductor channel 60 can be formed by annealing an amorphous semiconductor channel material layer (60U, 60I) and by removing portions of a semiconductor channel material layer (60V, 60R) located outside, i.e., above, a memory opening 49 in either order.

In one embodiment, a vertical semiconductor channel 60 can include a vertically-extending channel portion 60V extending through at least one alternating stack {(132, 142), (232, 242)} and having a first semiconductor material composition, and an annular channel cap portion 60C contacting a top end of the vertically-extending channel portion 60V and having a second semiconductor material composition that differs from the first semiconductor material composition only by presence of a higher concentration atoms of at least one dopant species, such as inert gas atoms (e.g., argon) and/or first conductivity type atoms (e.g., boron).

In one embodiment, an outer top periphery of the annular channel cap portion 60C is laterally offset from an inner top periphery of the annular channel cap portion 60C by a lateral distance (i.e., a lateral thickness of the annular channel cap portion 60C) that is greater than a thickness of the vertically-extending channel portion 60V at levels of the layers of the at least one alternating stack {(132, 142), (232, 242)}. In other words, the annular channel cap portion 60C is thicker than the vertically-extending channel portion 60V. In one embodiment, an outer top periphery of the annular channel cap portion 60C is laterally offset from an inner top periphery of the annular channel cap portion 60C by a lateral distance (i.e., a lateral thickness of the annular channel cap portion 60C) that is greater than a thickness of the vertically-extending channel portion 60V within a horizontal plane including an interface between the lower insulating cap sublayer 27A and the upper insulating sublayer 27B. In one embodiment, a lateral distance between the inner sidewall of the annular channel cap portion 60C and an outer sidewall of the annular channel cap portion 60C within a horizontal plane including a bottom periphery of the inner sidewall of the annular channel cap portion 60C is greater than a thickness of the vertically-extending channel portion 60V at levels of the layers of the at least one alternating stack {(132, 142), (232, 242)}.

In one embodiment, an entirety of an interface between the annular channel cap portion 60C and the vertically-extending channel portion 60V is located above a horizontal plane including an interface between the lower insulating cap sublayer 27A and the upper insulating cap sublayer 27B.

In one embodiment, the memory opening fill structure 58 comprises a drain region 63 having a doping of an opposite conductivity type than the vertical semiconductor channel 60 and contacting an inner sidewall of the annular channel cap portion 60C. In one embodiment, the drain region 63 contacts an entirety of the inner sidewall of the annular channel cap portion 60C and an upper cylindrical surface segment of an inner sidewall of the vertically-extending channel portion 60V.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the memory material layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly. In one embodiment, the memory opening fill structure 58 comprises a dielectric core 62 contacting an inner sidewall of a vertically-extending channel portion 60V and contacting a bottom surface of the drain region 63.

In one embodiment, the memory opening fill structure 58 comprises a first cylindrical surface segment contacting a cylindrical surface of the upper insulating cap sublayer 27B, a second cylindrical surface segment contacting a cylindrical surface of the lower insulating cap sublayer 27A and sidewalls of a subset of layers, and/or each insulating layer (132, 232), within the at least one alternating stack {(132, 142), (232, 242)}, and an annular surface segment connecting a bottom periphery of the first cylindrical surface segment and a top periphery of the second cylindrical surface segment and contacting the lower insulating cap sublayer 27A.

Figure 9K:
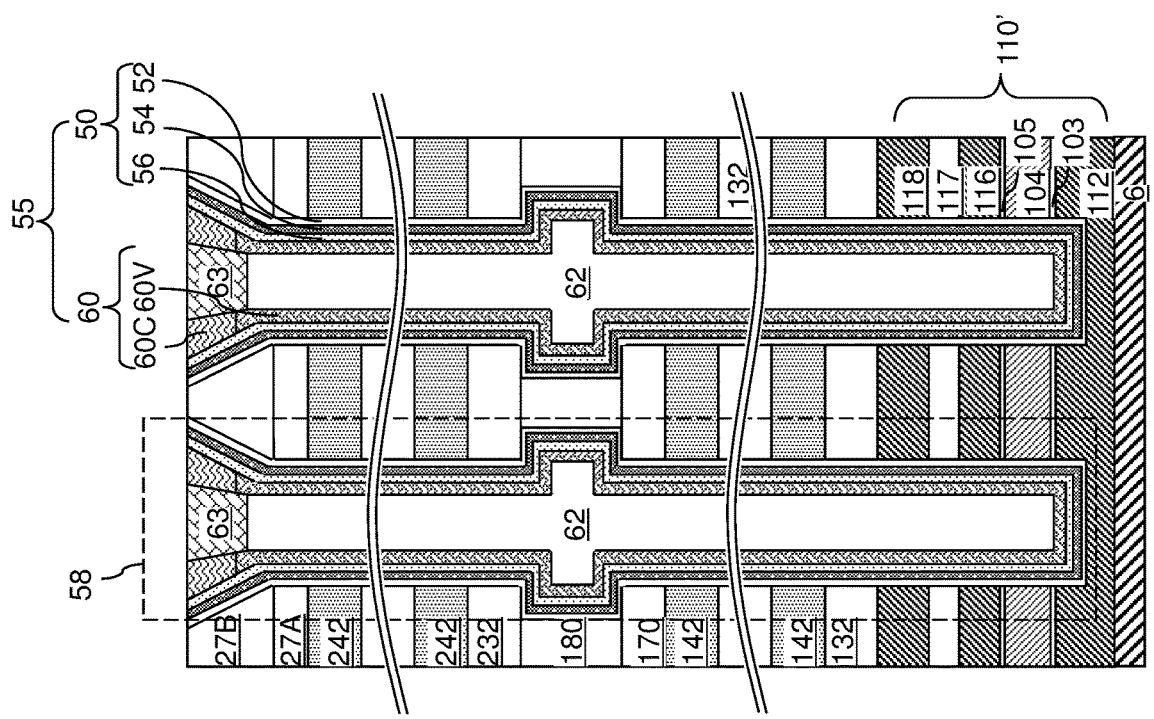
FIG. 9K is a vertical cross-sectional view of an alternative configuration of memory opening fill structures according to an embodiment of the present disclosure.

Referring to FIG. 9K, an alternative configuration of memory opening fill structures 58 in the exemplary structure is illustrated. The alternative configuration of the memory opening fill structures 58 can be provided by forming memory openings 49 such that tapered surfaces are formed as sidewalls of the upper insulating cap sublayer 27B during, or after, formation, of the memory openings. The angle of the tapered sidewalls of the upper insulating cap sublayer 27B with respect to the vertical direction may be in a range from 1 degree to 20 degrees, such as from 2 degrees to 10 degrees, although lesser and greater taper angles may also be employed. The bottom periphery of each tapered sidewall of the upper insulating cap sublayer 27B may be adjoined to, or may be laterally offset outward from, an upper periphery of an underlying sidewall of the lower insulating cap sublayer 27A around the same memory opening 49.

In this case, each memory opening fill structure 58 may comprise a tapered surface segment contacting a tapered surface of the upper insulating cap sublayer 27B, and a cylindrical surface segment contacting a cylindrical surface of the lower insulating cap sublayer 27A and sidewalls of a subset of layers, and/or each of the insulating layers (132, 232), within the at least one alternating stack {(132, 142), (232, 242)} and adjoined to a bottom periphery of the tapered surface segment.

Figure 10:
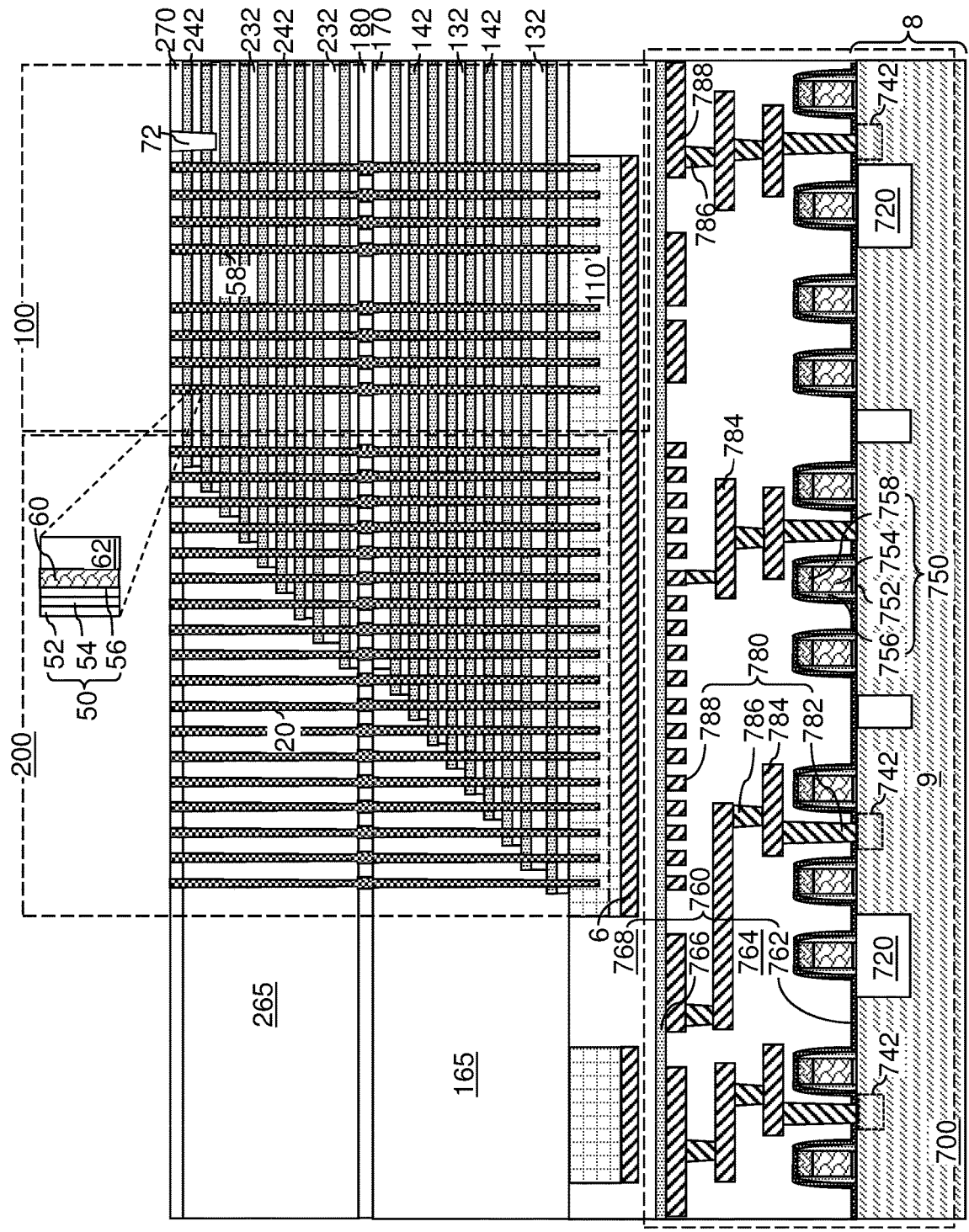
FIG. 10 is a vertical cross-sectional view of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
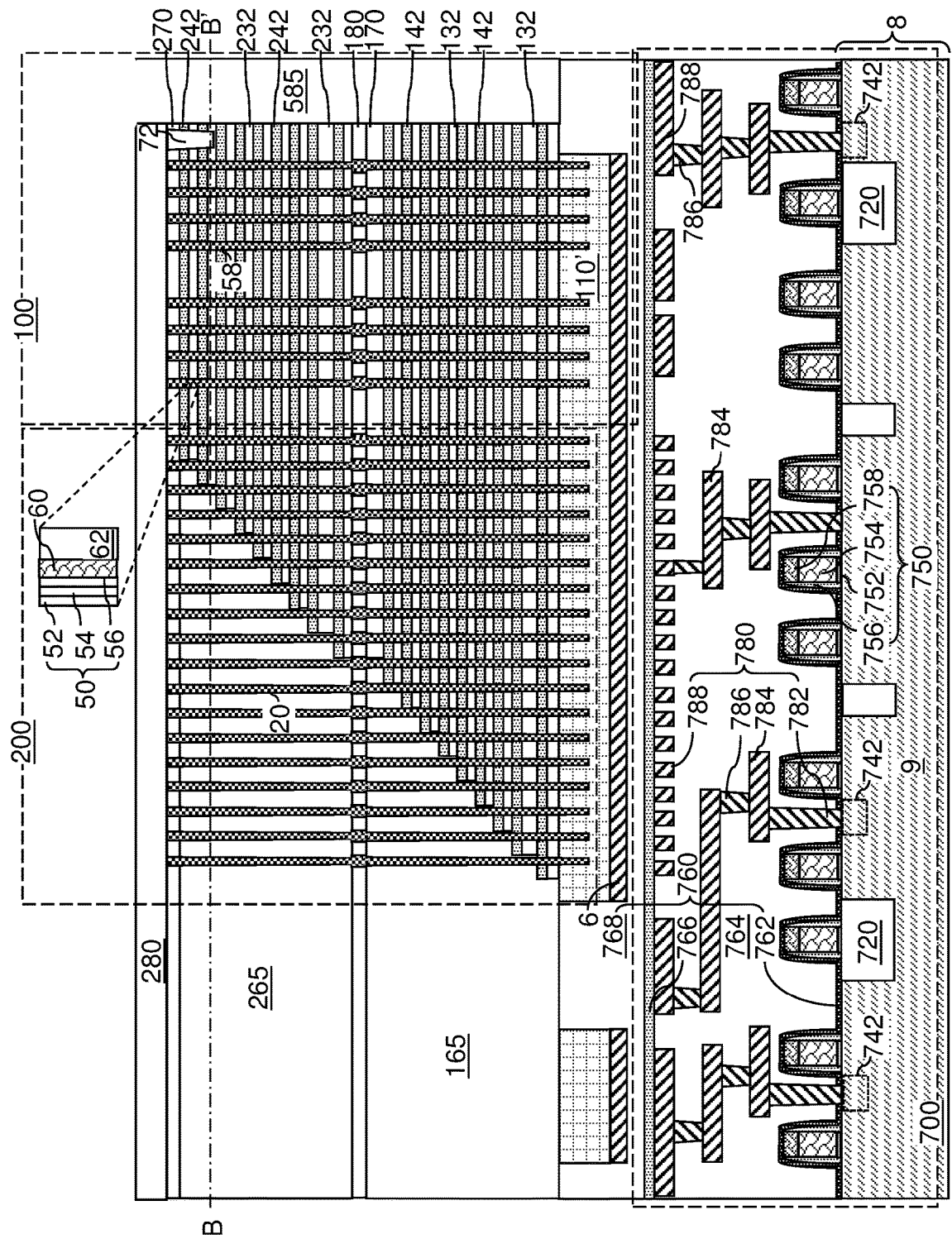
FIG. 11A is a vertical cross-sectional view of the exemplary structure after formation of pillar cavities according to an embodiment of the present disclosure.
Figure 11B:
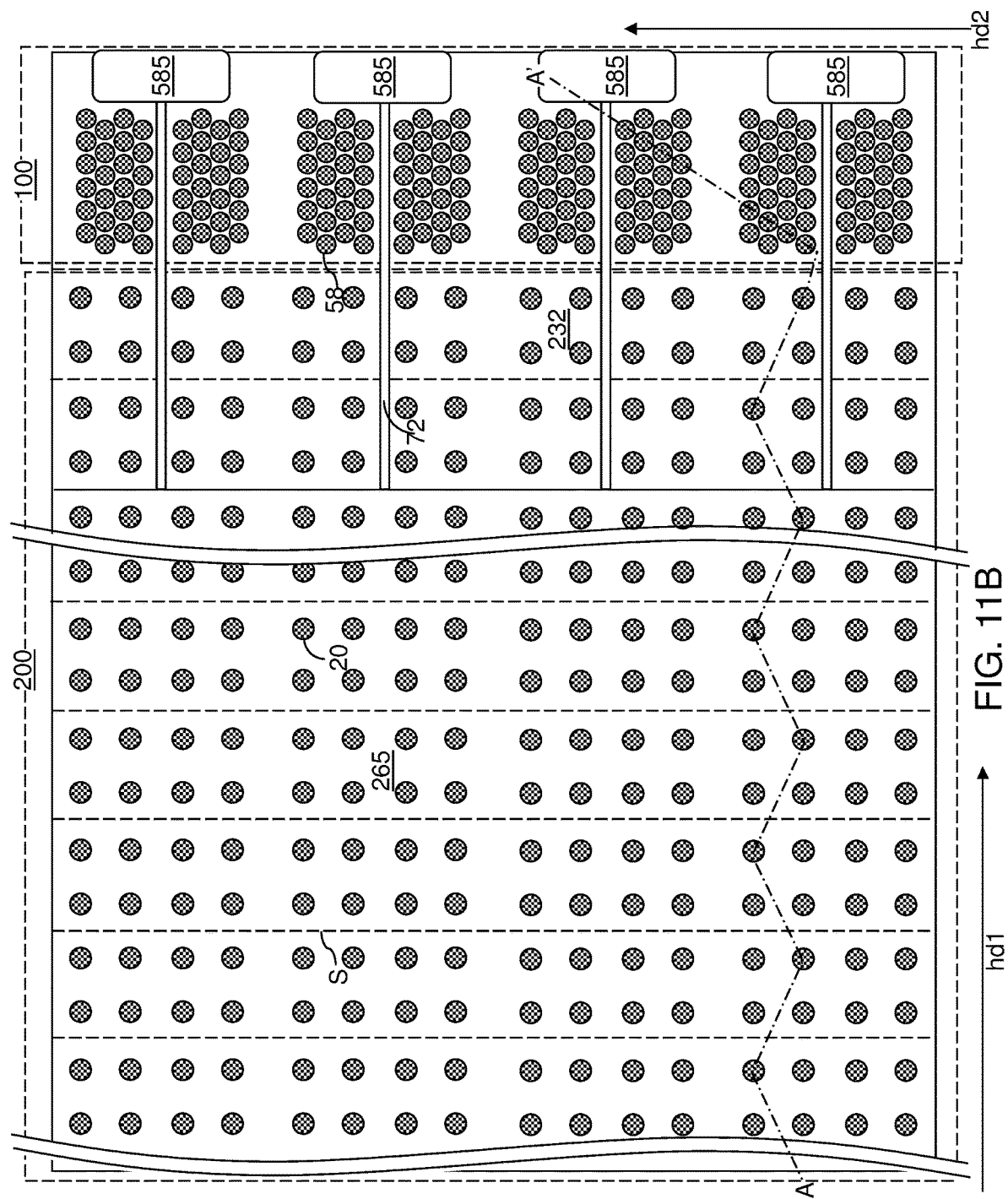
FIG. 11B is a horizontal cross-sectional view of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 12:
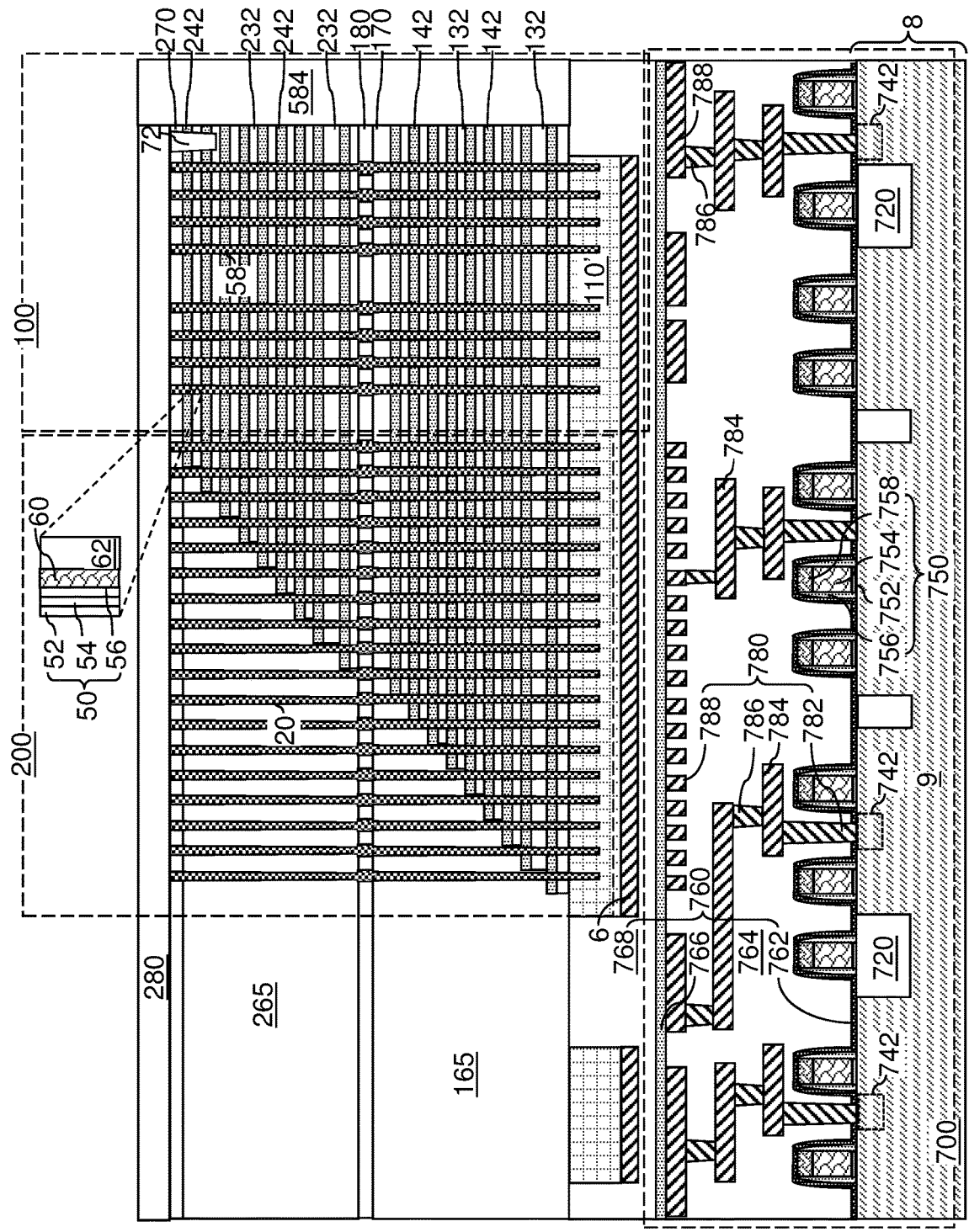
FIG. 12 is a vertical cross-sectional view of the exemplary structure after formation of dielectric pillar structures according to an embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 13A:
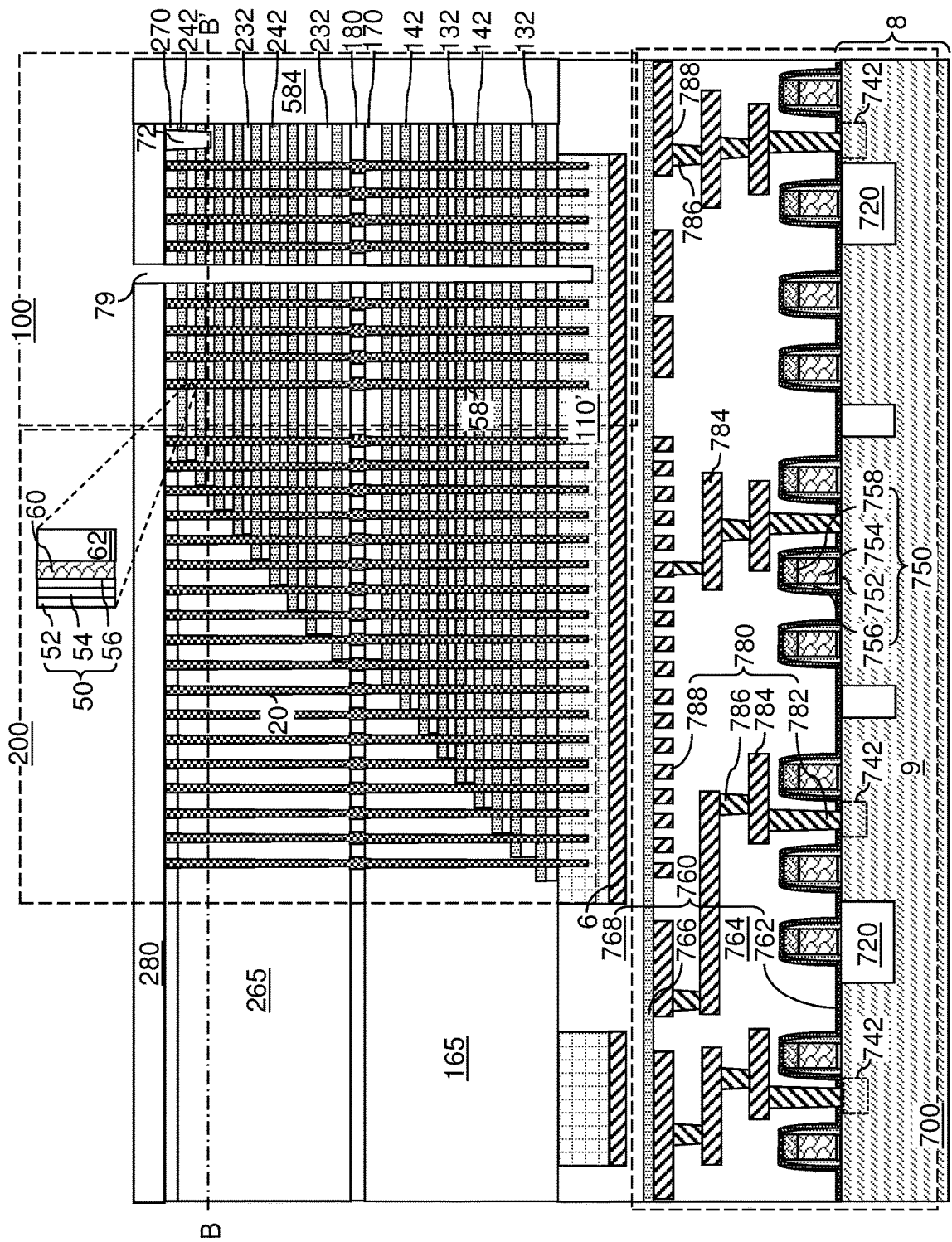
FIG. 13A is a vertical cross-sectional view of the exemplary structure after formation of a first contact-level dielectric layer and backside trenches according to an embodiment of the present disclosure.
Figure 13B:
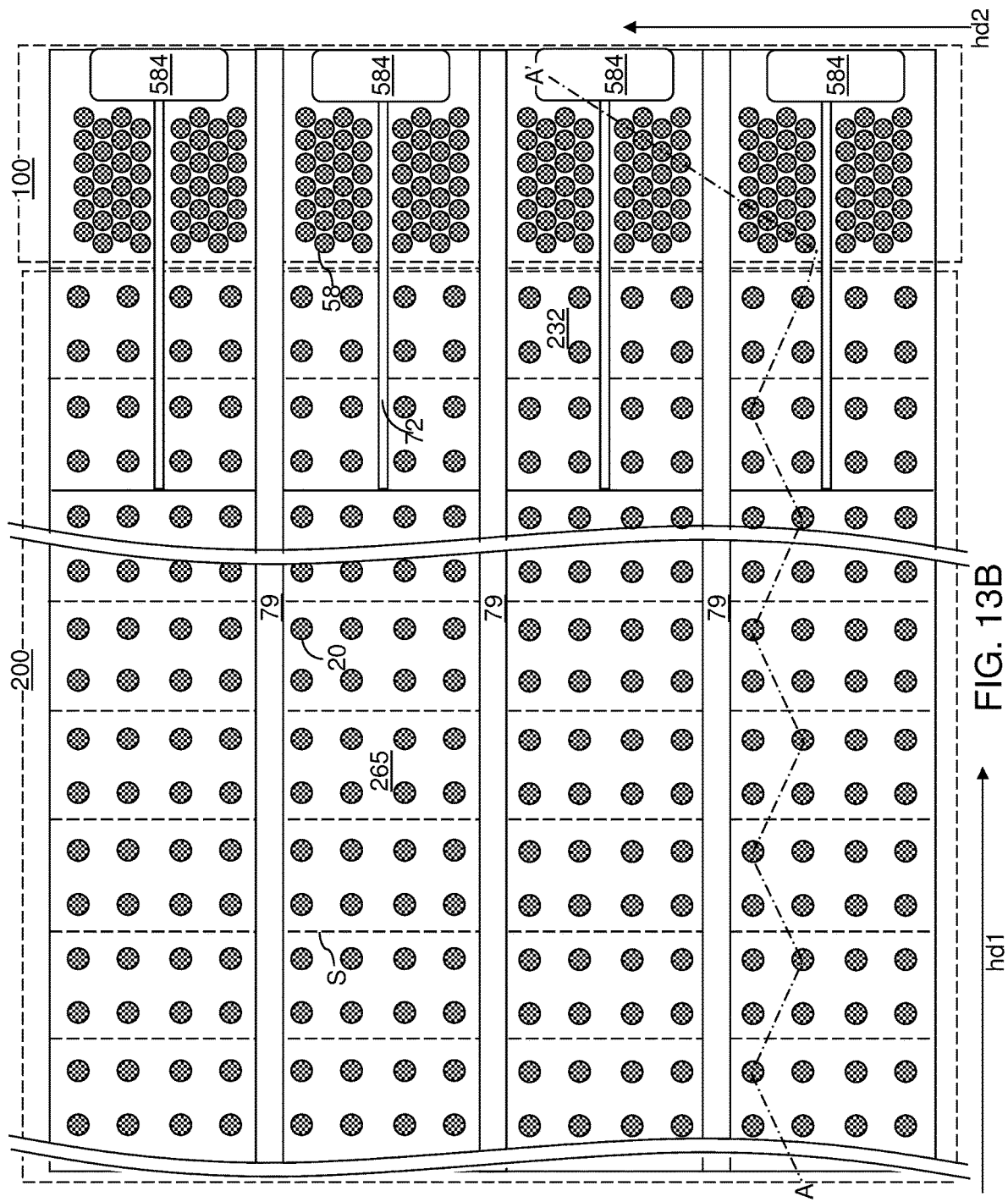
FIG. 13B is a horizontal cross-sectional view of the exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 14:
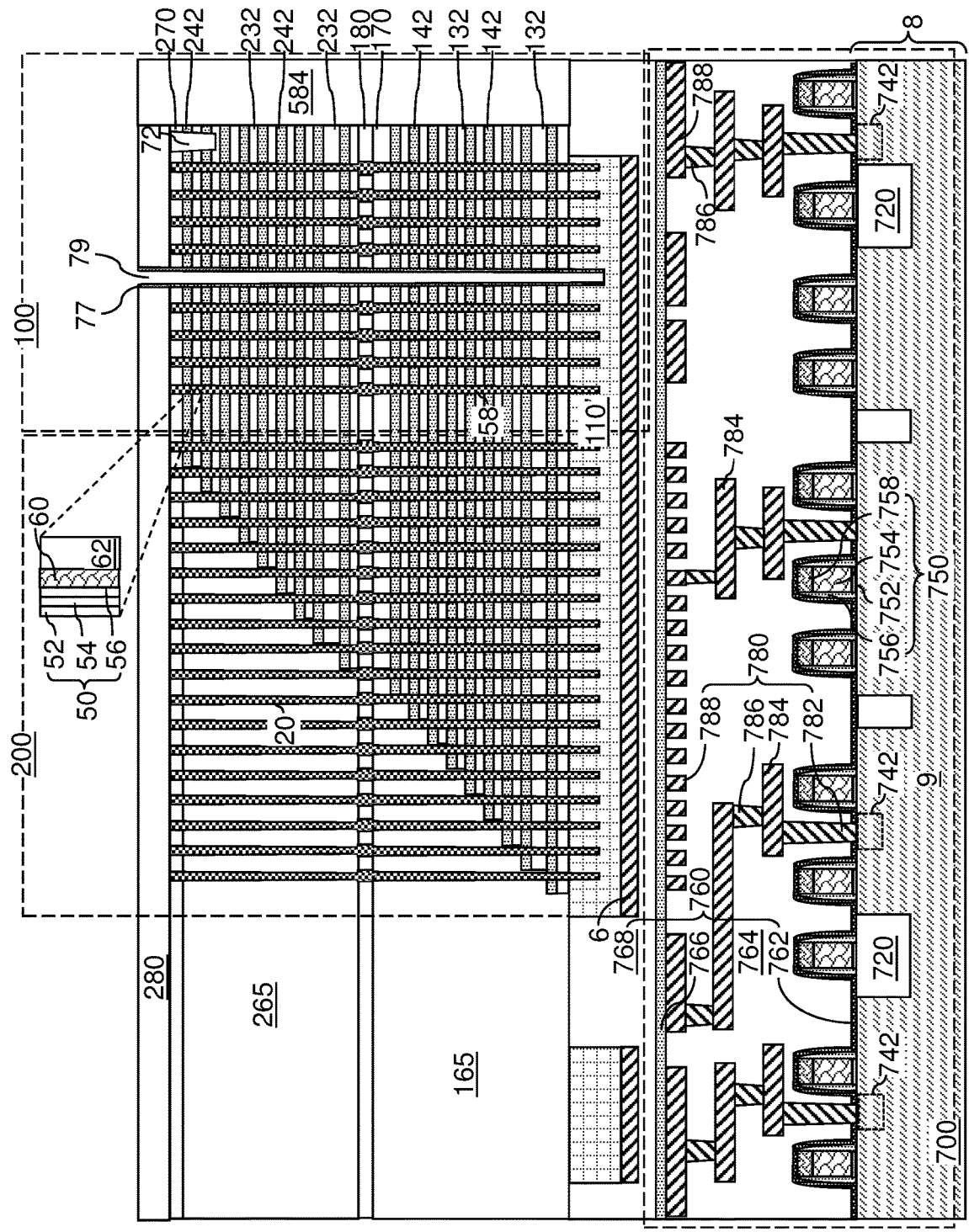
FIG. 14 is a vertical cross-sectional view of the exemplary structure after formation of backside trench spacers according to an embodiment of the present disclosure.
Figure 15A:
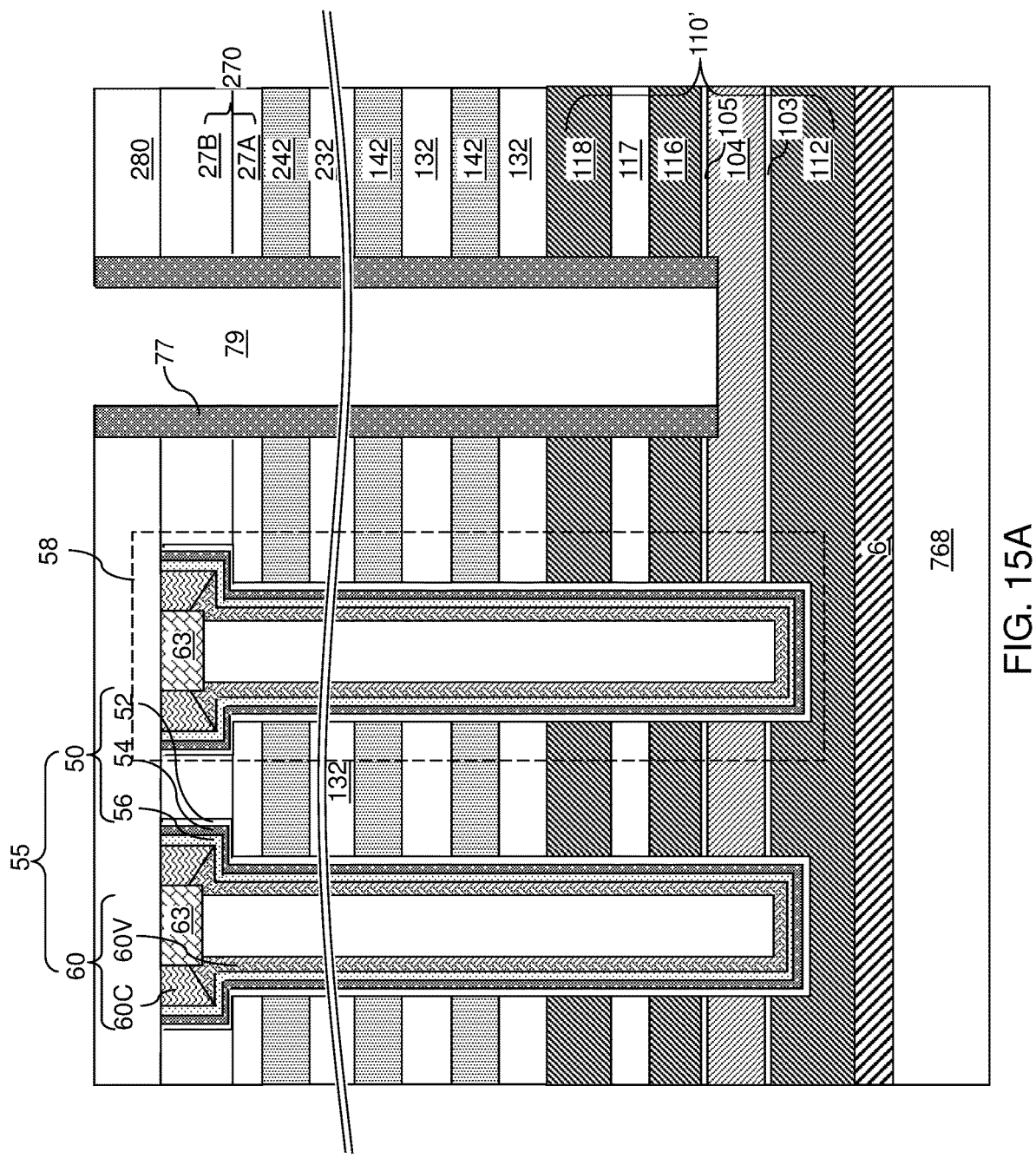
FIGS. 15A-15E illustrate sequential vertical cross-sectional views of memory opening fill structures and a backside trench during formation of source-level material layers according to an embodiment of the present disclosure.

Referring to FIGS. 14 and 15A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 15B:
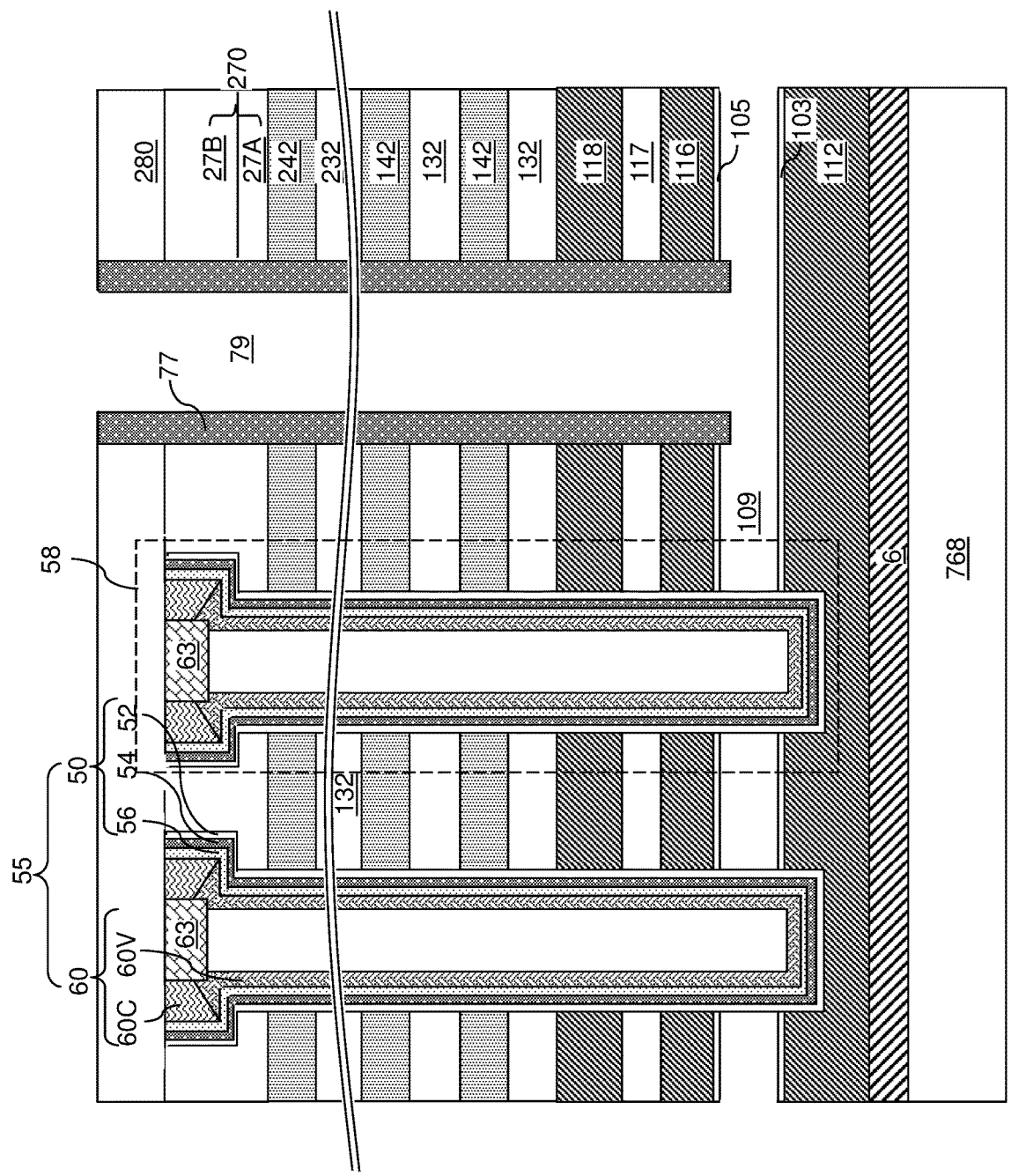

Referring to FIG. 15B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals, such as hot TMY and TMAH, are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY or TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 15C:
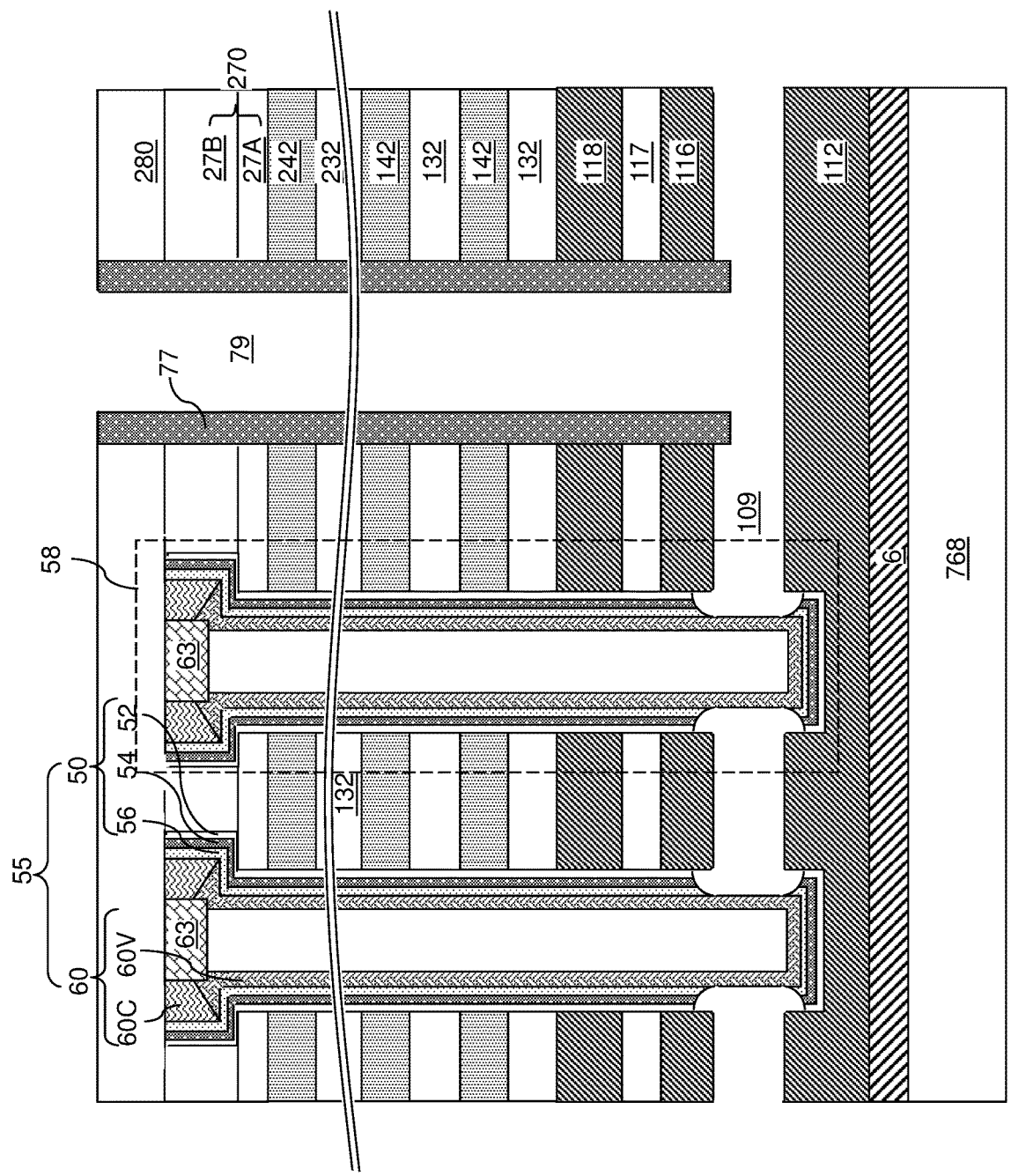

Referring to FIG. 15C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15D:
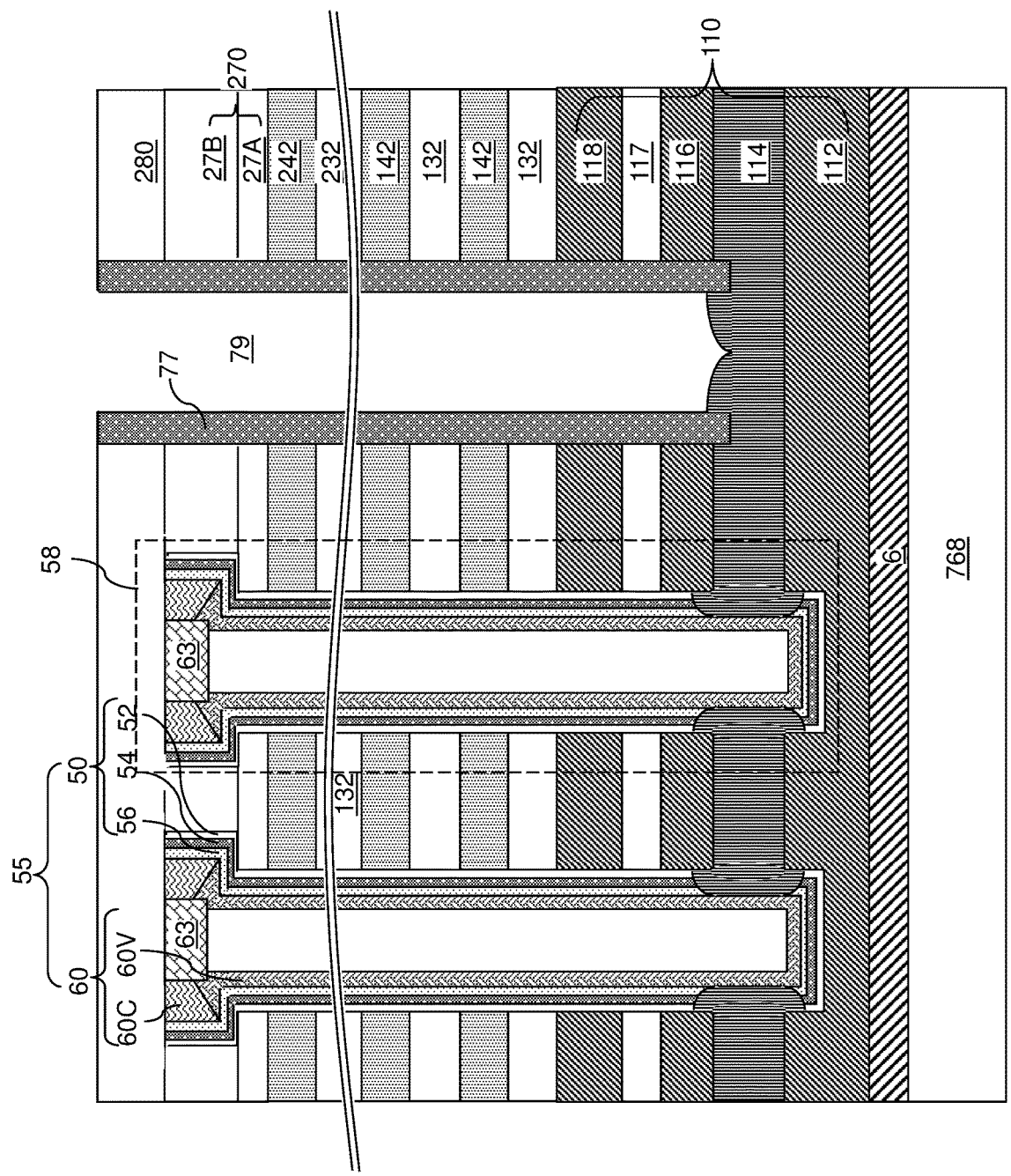

Referring to FIG. 15D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material (e.g., polysilicon or amorphous silicon) of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 15E:
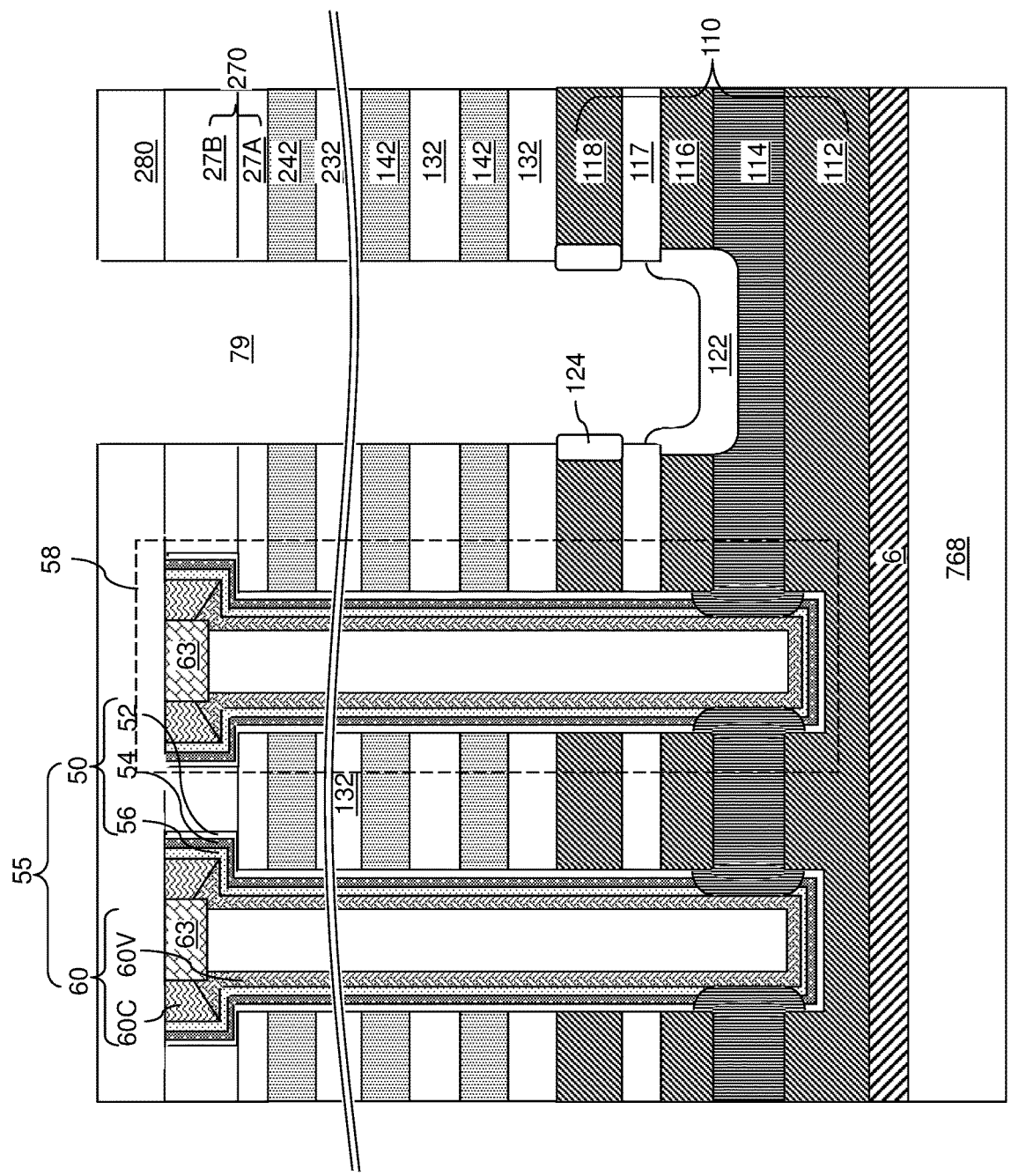
Figure 16:
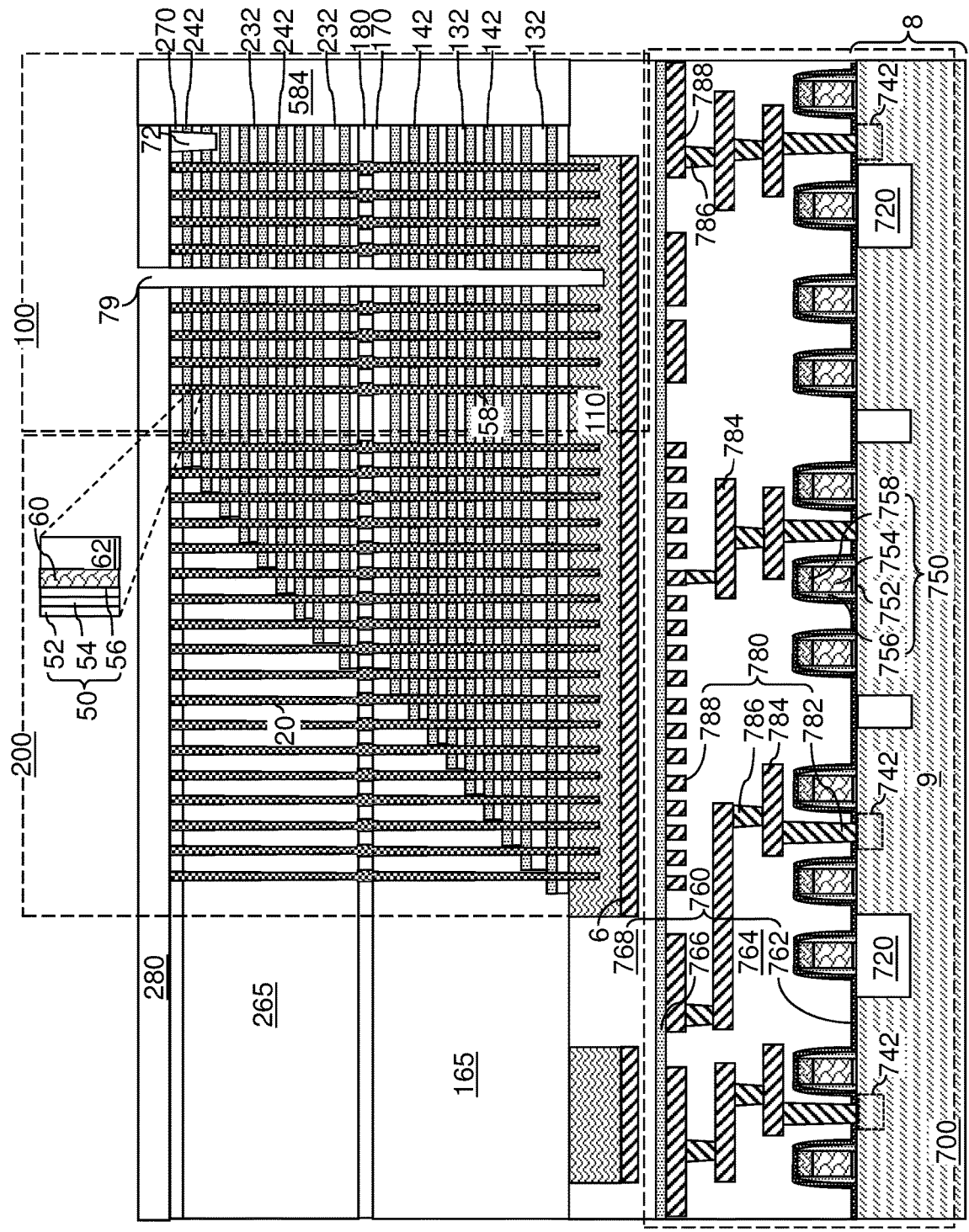
FIG. 16 is a vertical cross-sectional view of the exemplary structure after formation of source-level material layers according to an embodiment of the present disclosure.

Referring to FIGS. 15E and 16, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 17:
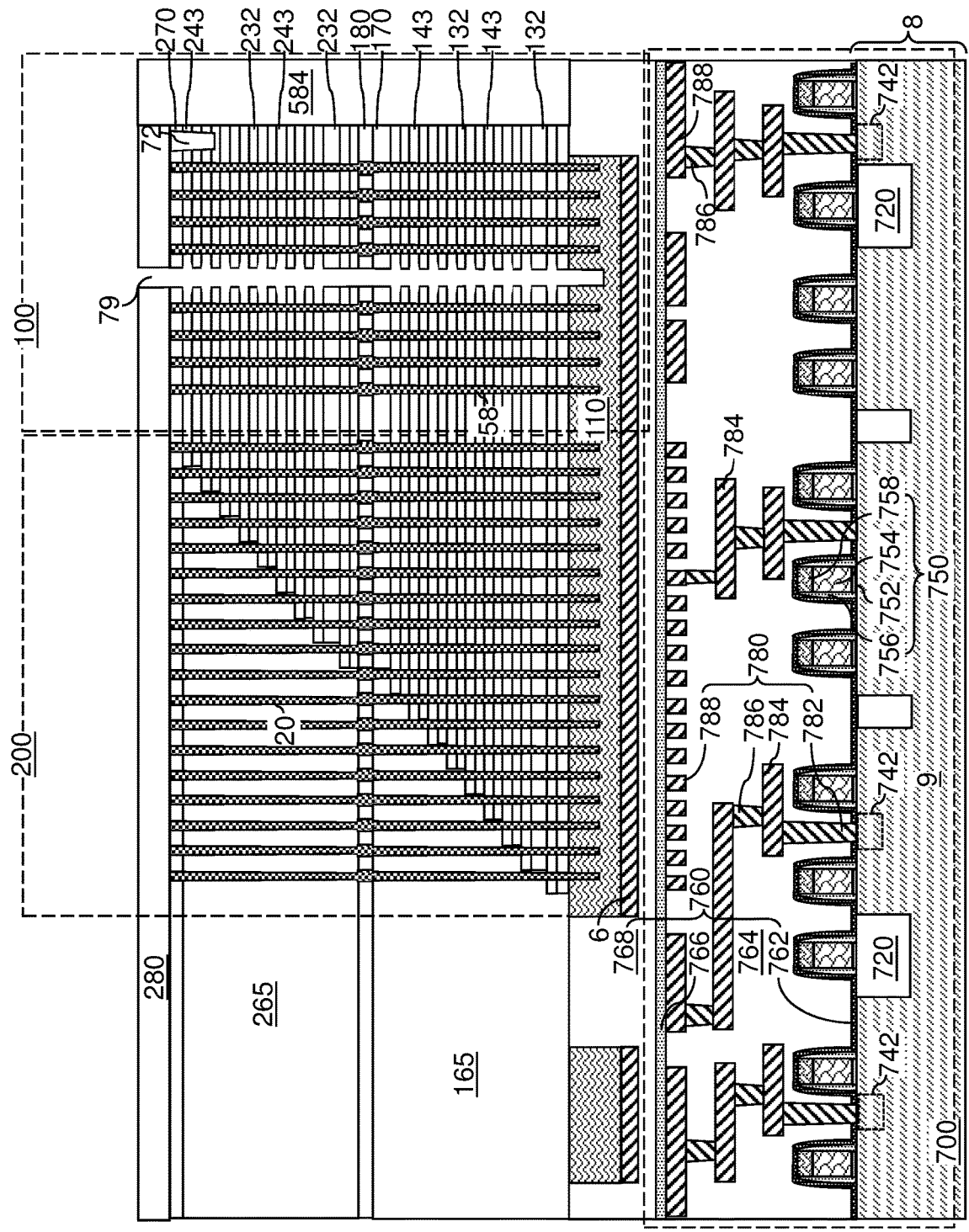
FIG. 17 is a vertical cross-sectional view of the exemplary structure after formation of backside recesses according to an embodiment of the present disclosure.

Referring to FIG. 17, the sacrificial material layers (142, 242) are removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 18A:
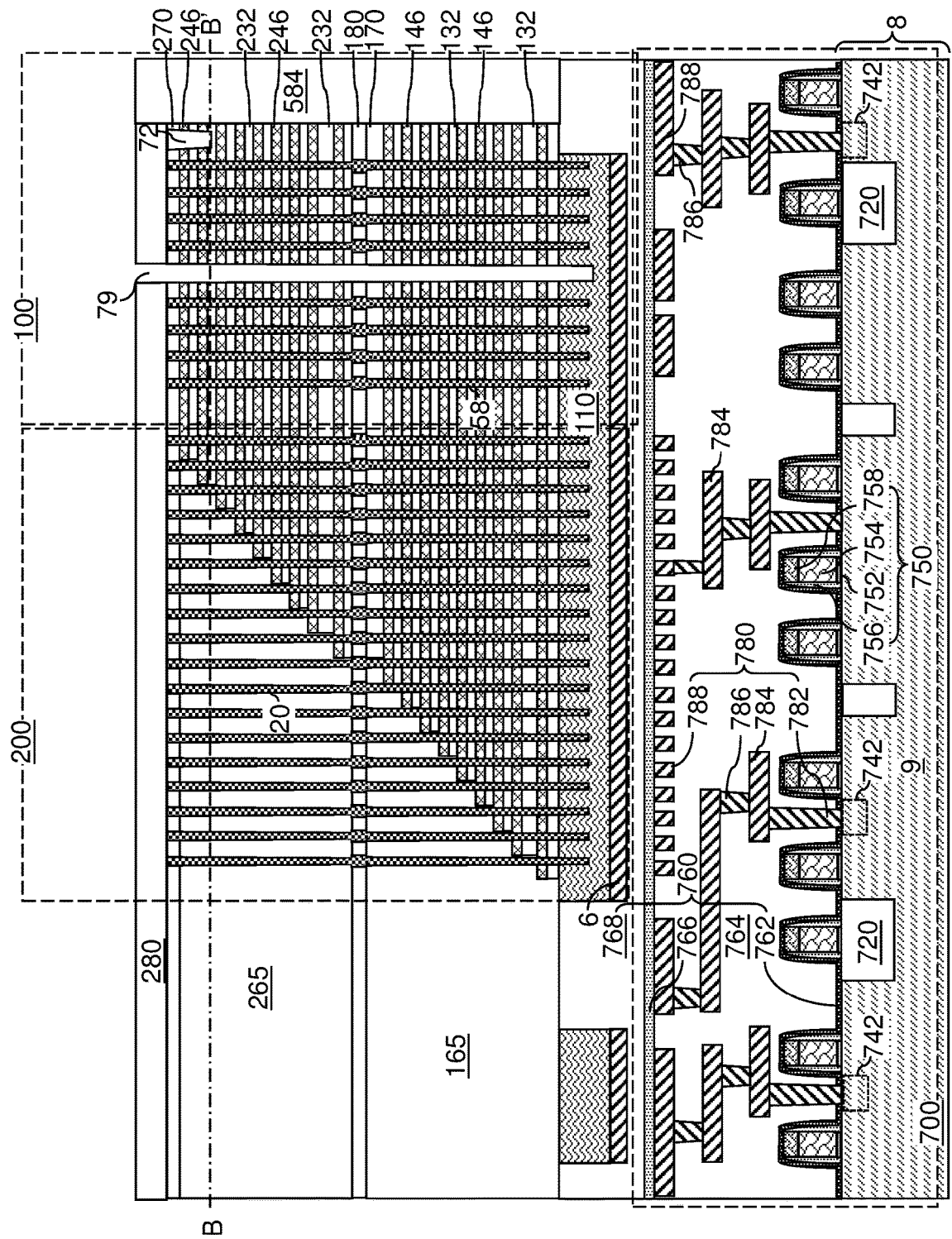
FIG. 18A is a vertical cross-sectional view of the exemplary structure after formation of electrically conductive layers according to an embodiment of the present disclosure.
Figure 18B:
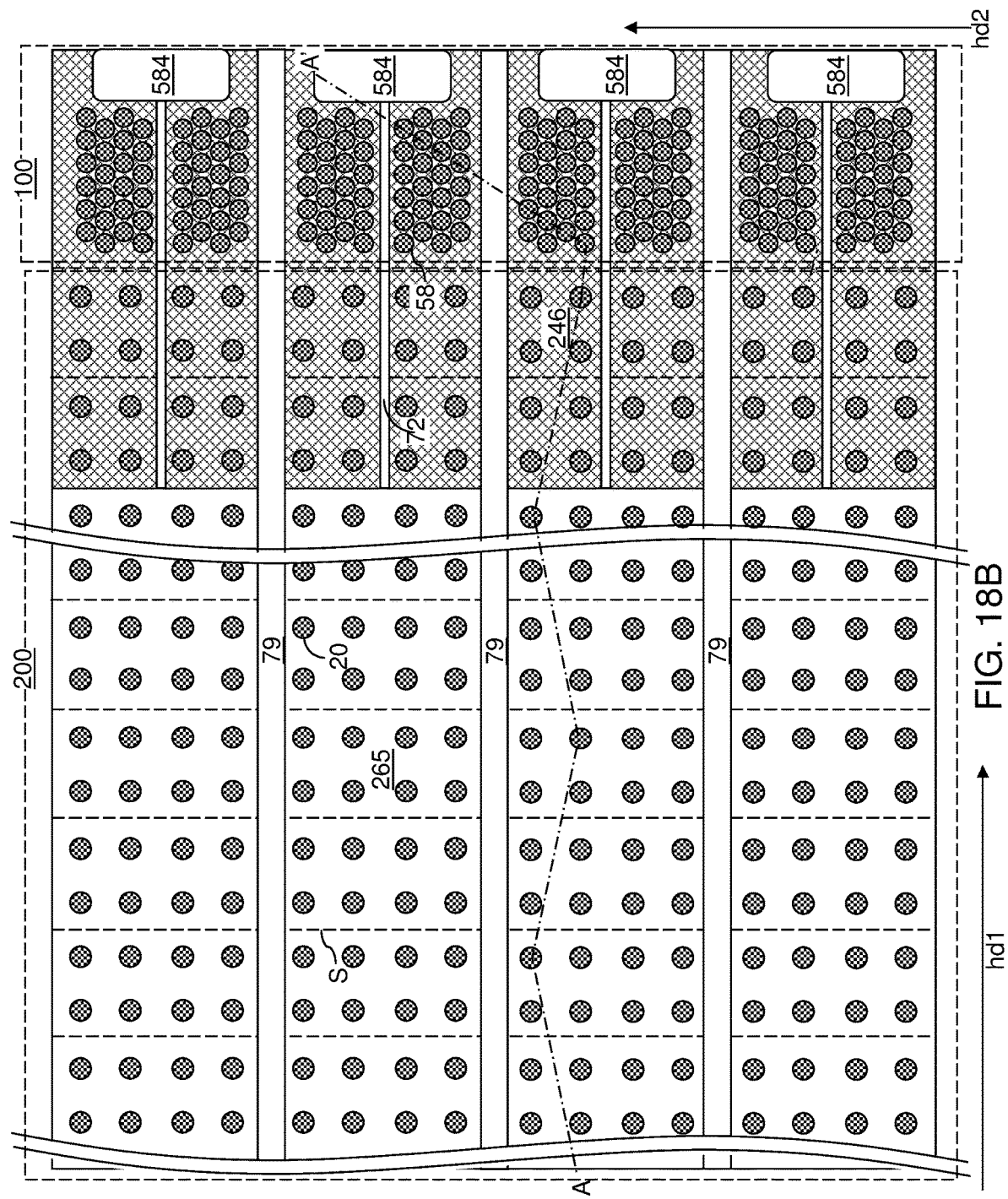
FIG. 18B is a horizontal cross-sectional view of the exemplary structure along the horizontal plane B-B' of FIG. 18A. The hinged vertical plane A-A' corresponds to the plane of the vertical cross-sectional view of FIG. 18A.
Figure 18C:
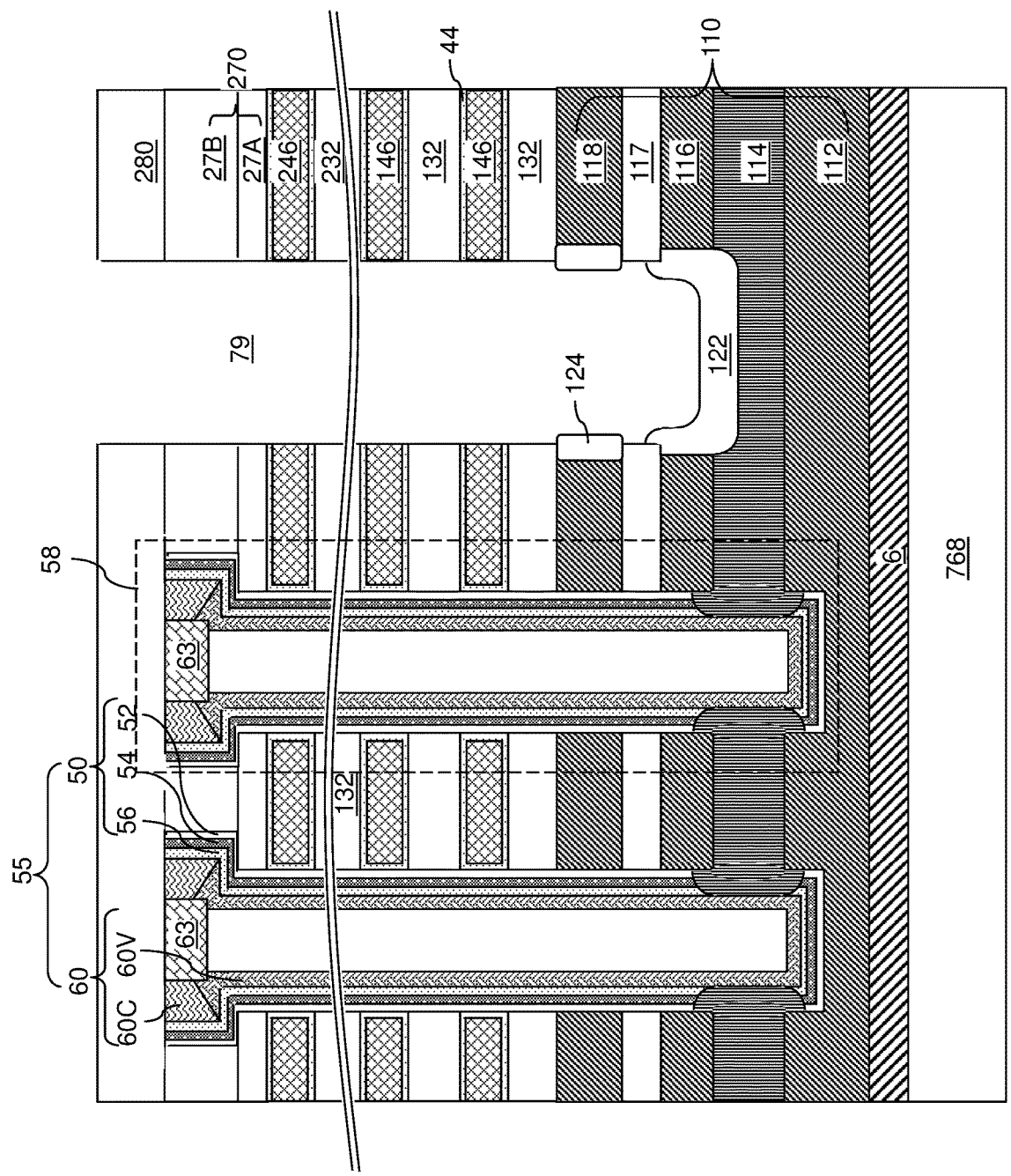
FIG. 18C is a magnified view of a region of the exemplary structure of FIG. 18A.
Figure 19A:
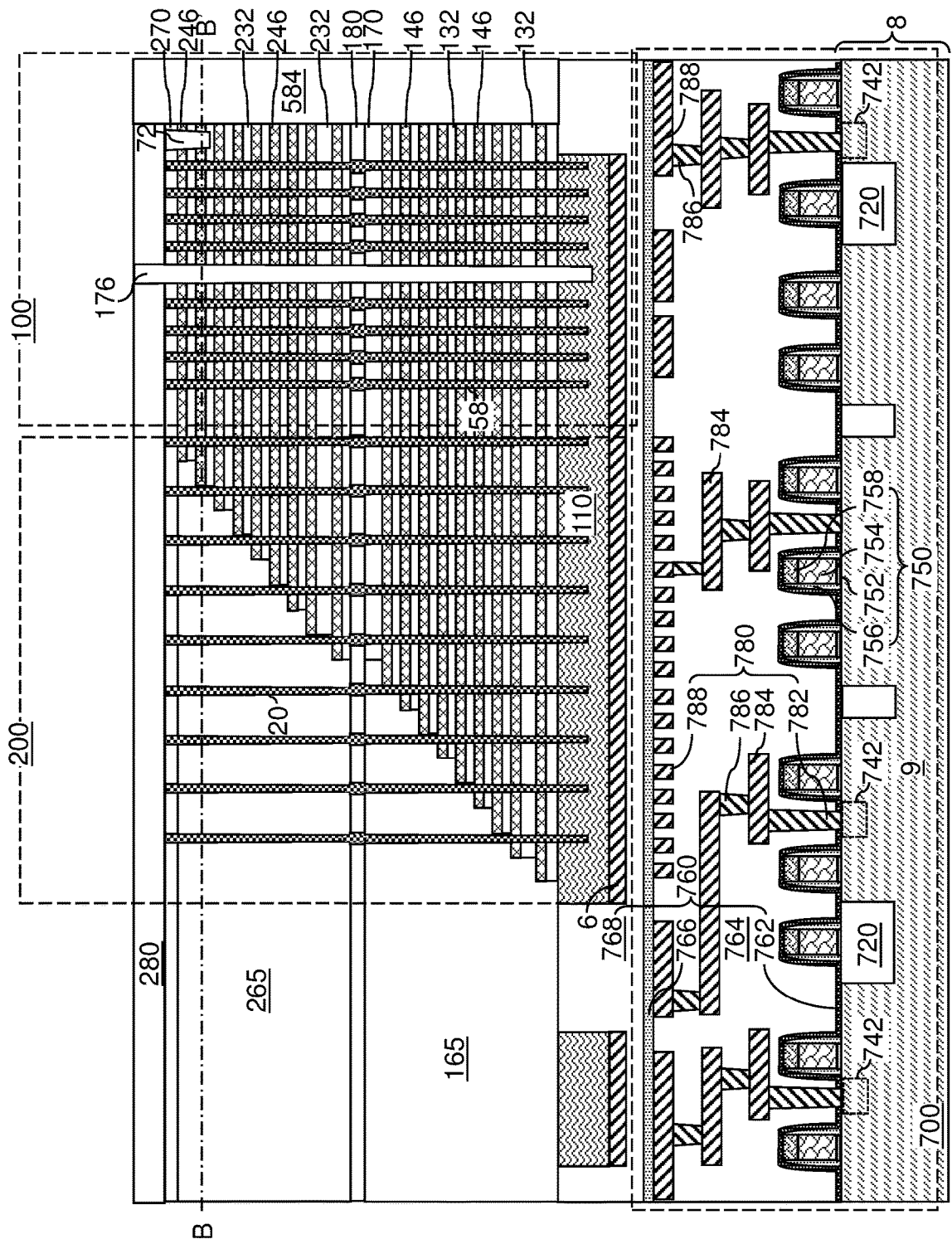
FIG. 19A is a vertical cross-sectional view of the exemplary structure after formation of backside trench fill structures in the backside trenches according to an embodiment of the present disclosure.
Figure 19B:
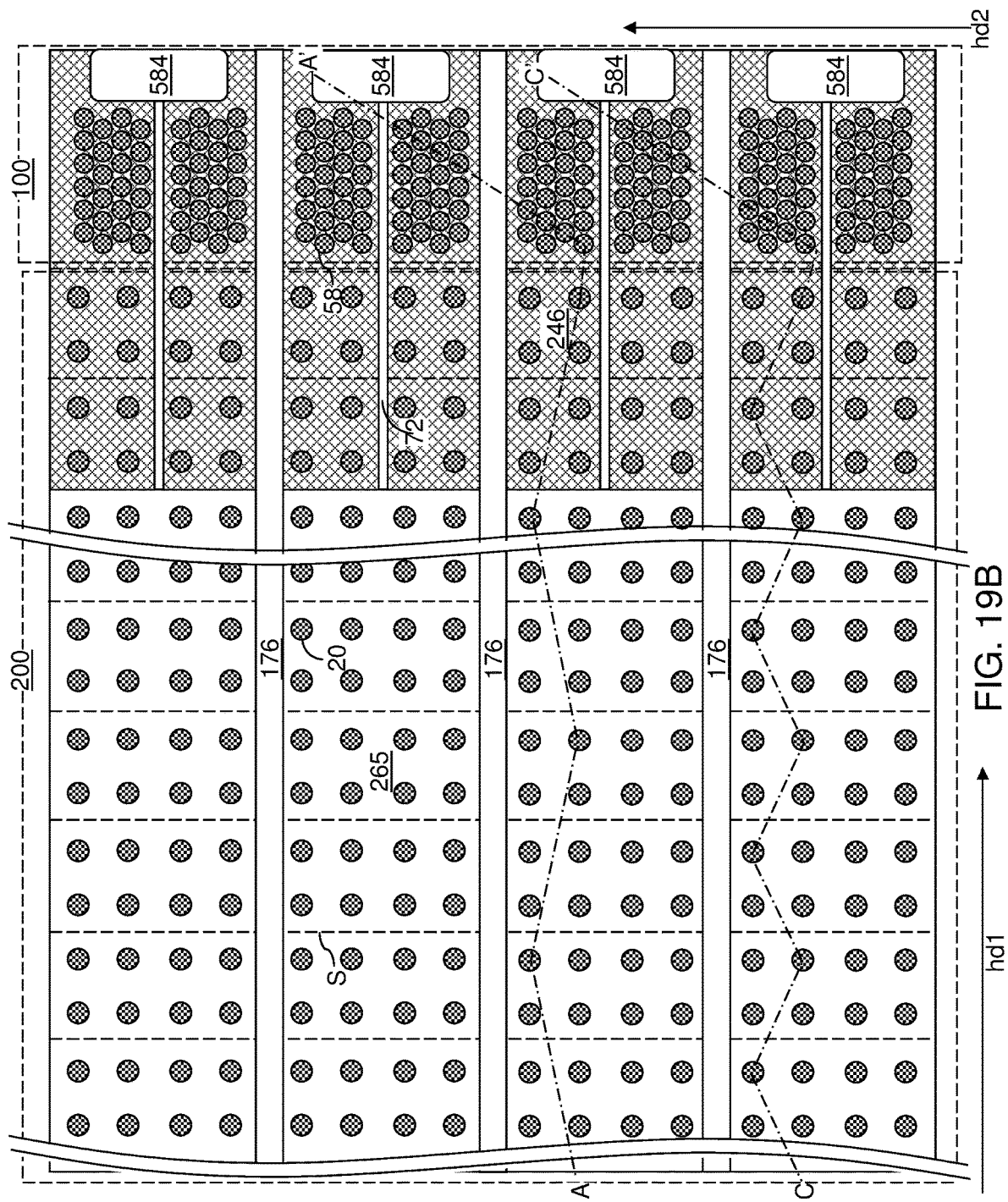
FIG. 19B is a horizontal cross-sectional view of the exemplary structure along the horizontal plane B-B' of FIG. 19A. The hinged vertical plane A-A' corresponds to the plane of the vertical cross-sectional view of FIG. 19A.
Figure 19C:
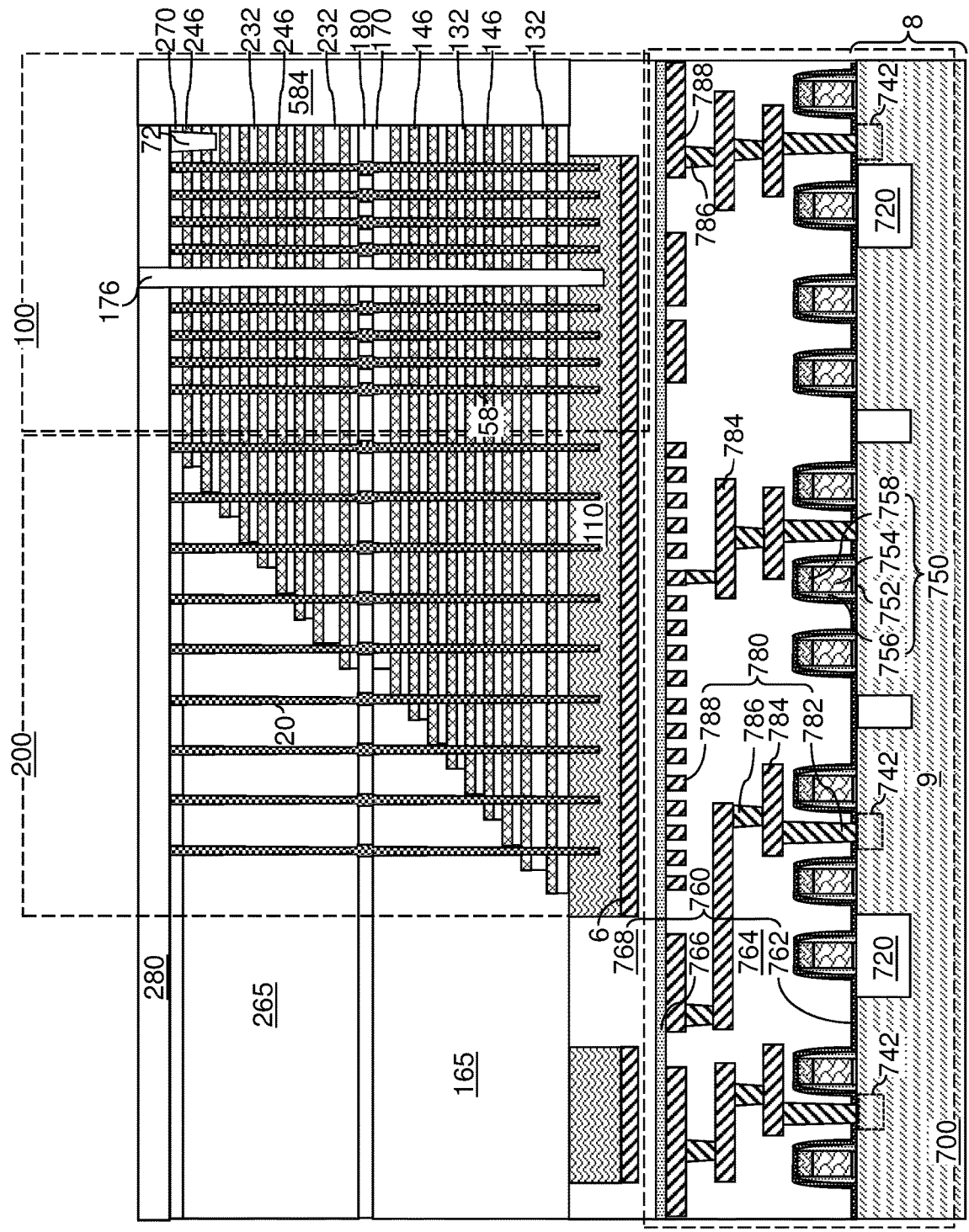
FIG. 19C is a vertical cross-sectional view of the exemplary structure along the vertical plane C-C' of FIG. 19B.
Figure 19D:
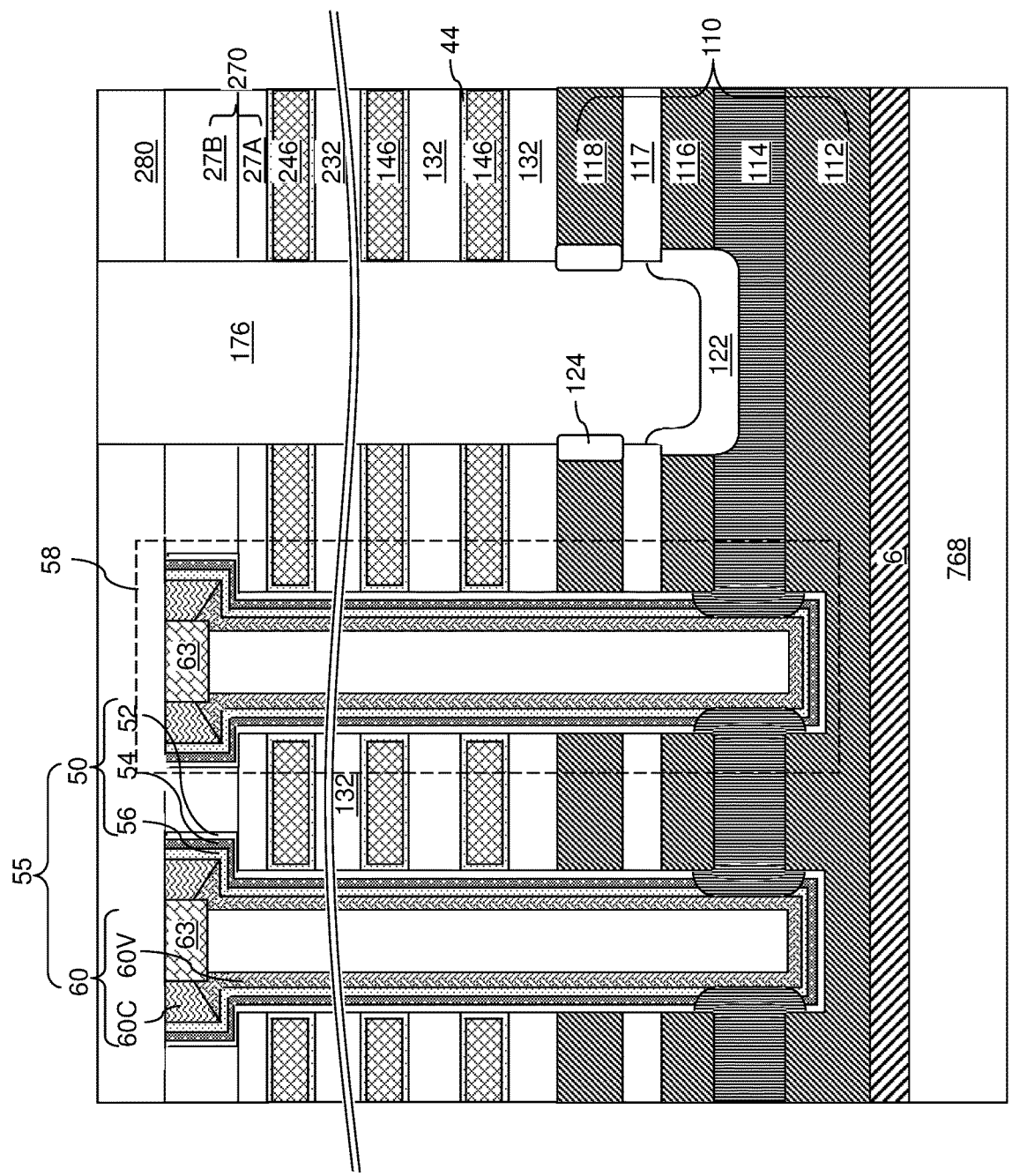
FIG. 19D is a magnified view of a region of the exemplary structure of FIG. 19A.

Referring to FIGS. 18A-18C, a backside blocking dielectric layer 44 may be optionally deposited in the backside recesses (143, 243) and the backside trenches 79 and over the first contact-level dielectric layer 280. The backside blocking dielectric layer 44 includes a dielectric material such as a dielectric metal oxide, silicon oxide, or a combination thereof. For example, the backside blocking dielectric layer 44 may include aluminum oxide. The backside blocking dielectric layer 44 may be formed by a conformal deposition process such as atomic layer deposition or chemical vapor deposition. The thickness of the backside blocking dielectric layer 44 may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, MoN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer 44 and a first electrically conductive layer 146, and each second sacrificial material layer 242 may be replaced with an optional portion of the backside blocking dielectric layer 44 and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 19A-19D, a dielectric fill material may be conformally deposited in the backside trenches 79 and over the first contact-level dielectric layer 280 by a conformal deposition process. The dielectric fill material may include, for example, silicon oxide. Each portion of the dielectric fill material that fill a backside trench 79 constitutes a dielectric backside trench fill structure 176. The horizontally-extending portion of the dielectric fill material that is deposited over the first contact-level dielectric layer 280 may be removed by a planarization process, or may be incorporated into the first contact-level dielectric layer 280.

Figure 20A:
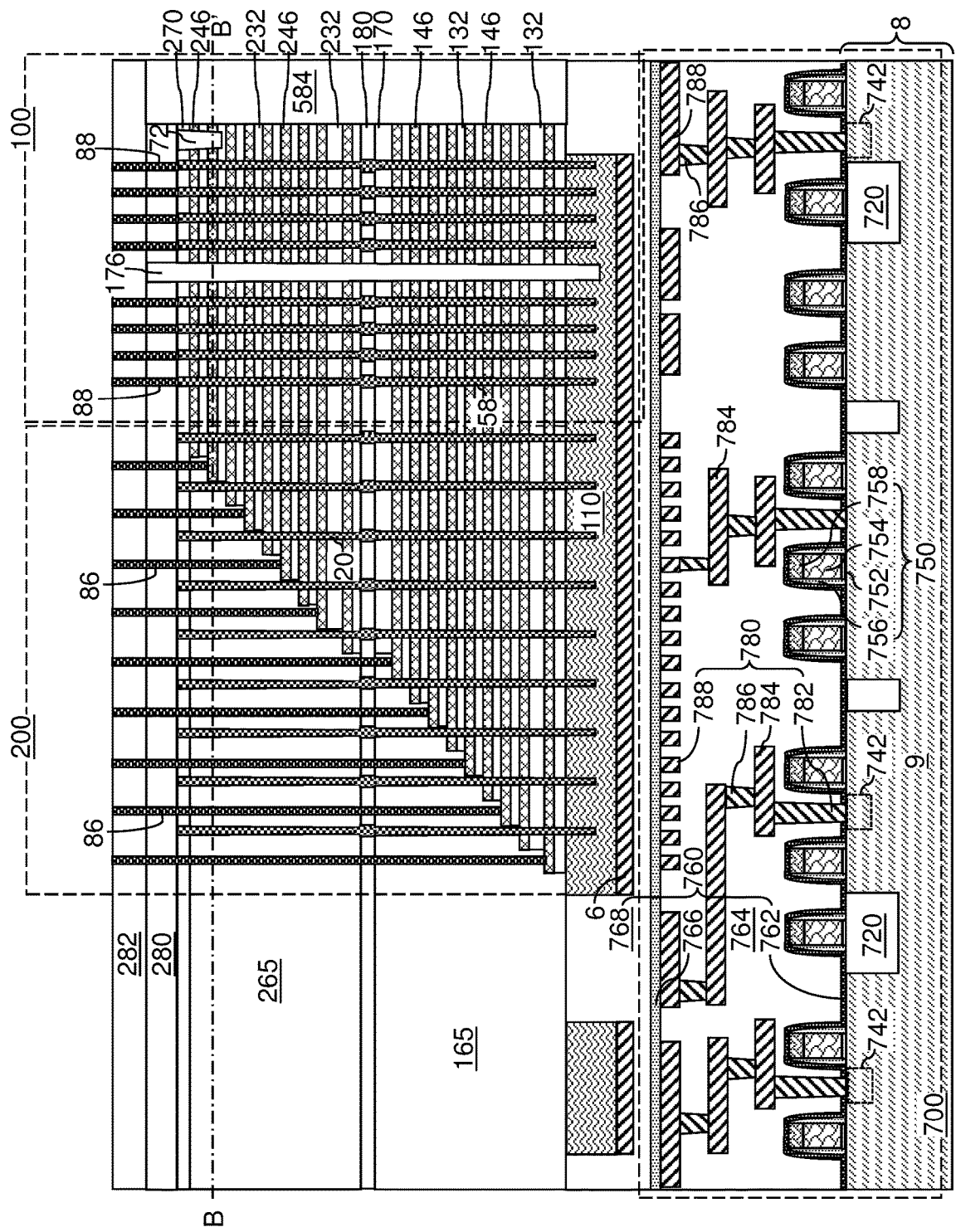
FIG. 20A is a vertical cross-sectional view of the exemplary structure after formation of a second contact-level dielectric layer and various contact via structures according to an embodiment of the present disclosure.
Figure 20B:
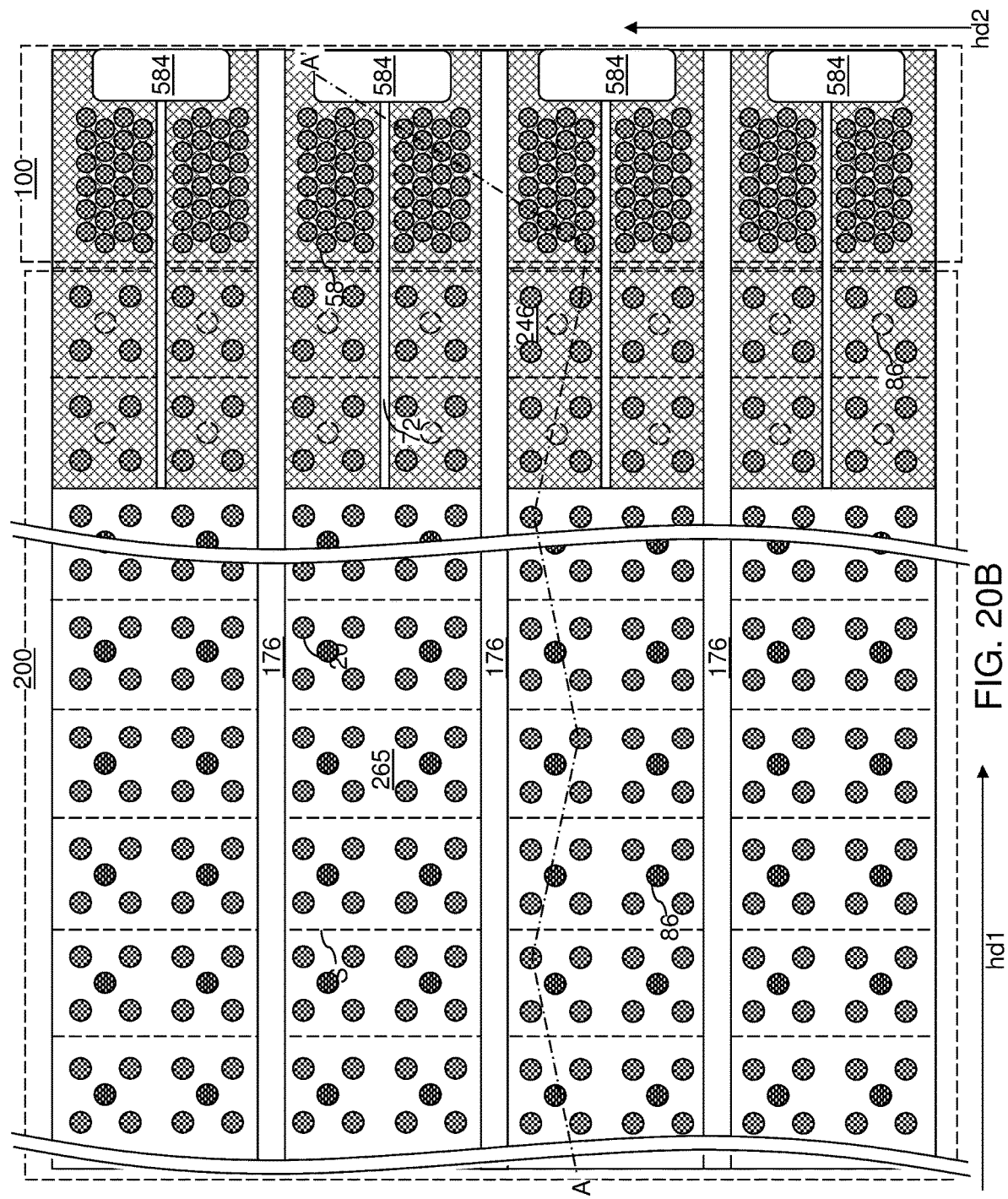
FIG. 20B is a horizontal cross-sectional view of the exemplary structure along the vertical plane B-B' of FIG. 20A. The hinged vertical plane A-A' corresponds to the plane of the vertical cross-sectional view of FIG. 20A.

Referring to FIGS. 20A and 20B, a second contact-level dielectric layer 282 may be formed over the first contact-level dielectric layer 280. The second contact-level dielectric layer 280 may be deposited after formation of the dielectric backside trench fill structures 176, or may comprise a horizontally-extending portion of the dielectric fill material of the dielectric backside trench fill structures 176 that is formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55. The staircase-region contact via structures 86 may also include source select level contact via structures that contact a subset of the second electrically conductive layers 246 that function as source select level gate electrodes.

Figure 21:
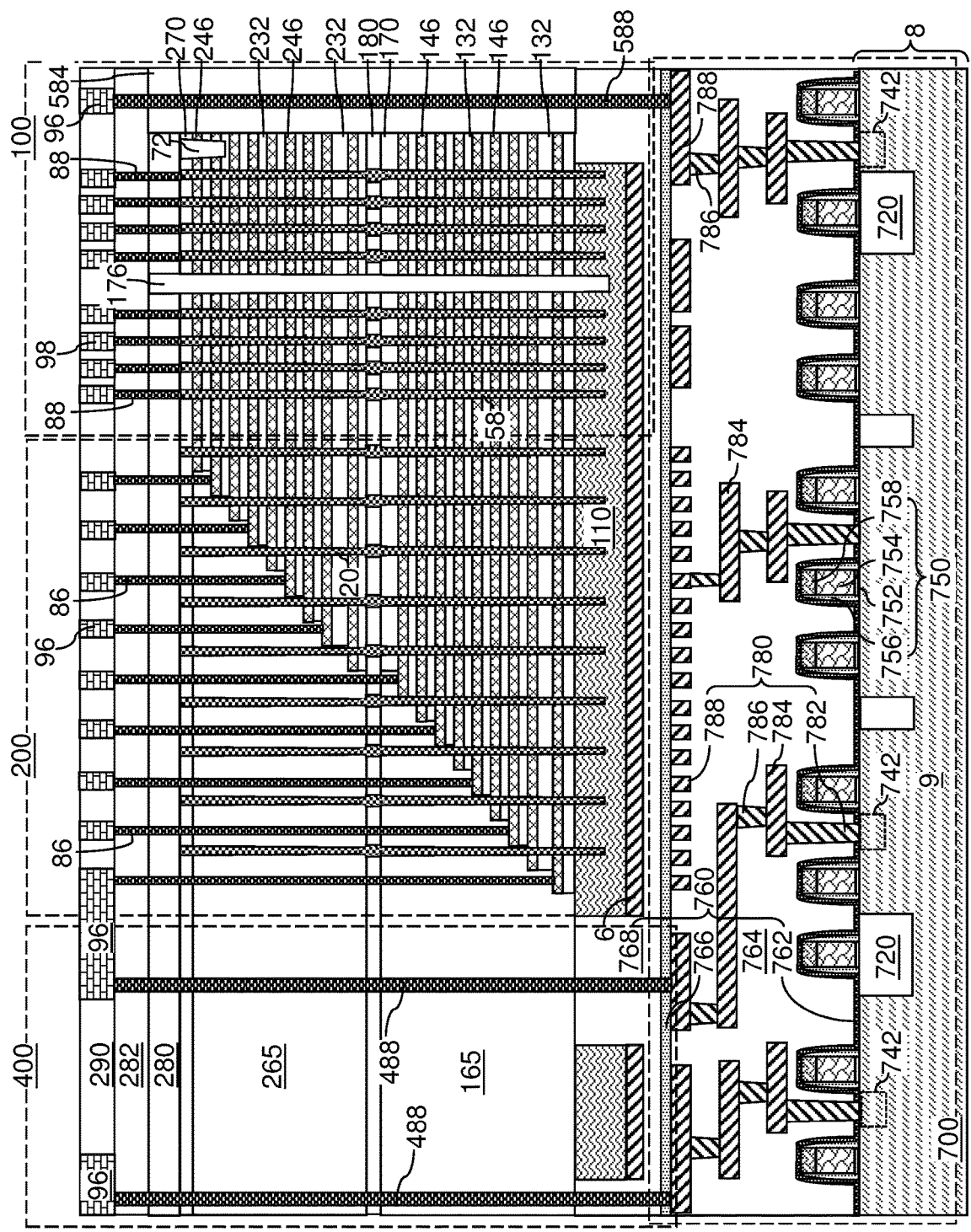
FIG. 21 is a vertical cross-sectional view of the exemplary structure after formation of through-memory-level via structures and upper metal line structures according to an embodiment of the present disclosure.

Referring to FIG. 21, peripheral-region via cavities may be formed through the second and first contact-level dielectric layers (282, 280), the second and first retro-stepped dielectric material portions (265, 165), and the at least one second dielectric layer 768 to top surfaces of a first subset of the lower-level metal interconnect structure 780 in the peripheral device region 400. Through-memory-region via cavities may be formed through the interconnection region dielectric fill material portions 584 and the at least one second dielectric layer 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Referring to all drawings and according to various embodiments of the present disclosure, a three-dimensional memory device comprises: an alternating stack {(132, 146), (232, 246)} of insulating layers (132, 232) and electrically conductive layers (146, 246); an insulating cap layer 270 including a stack of a lower insulating cap sublayer 27A and an upper insulating cap sublayer 27B and overlying the alternating stack {(132, 146), (232, 246)}; a memory opening vertically extending through the insulating cap layer 270 and the alternating stack {(132, 146), (232, 246)}, wherein the memory opening 49 has a greater lateral dimension at a level of the upper insulating cap sublayer 27B than at a level of the lower insulating cap sublayer 27A; and a memory opening fill structure 58 located in the memory opening 49, wherein the memory opening fill structure 58 comprises a memory film 50 and a vertical semiconductor channel that includes a vertically-extending channel portion 60V extending through alternating stack {(132, 146), (232, 246)} and having a first semiconductor material composition and an annular channel cap portion 60C contacting a top end of the vertically-extending channel portion 60V and having a second semiconductor material composition that differs from the first semiconductor material composition by presence of additional atoms of at least one dopant species.

In one embodiment, an outer top periphery of the annular channel cap portion 60C is laterally offset from an inner top periphery of the annular channel cap portion 60C by a lateral distance that is greater than a thickness of the vertically-extending channel portion 60V at a level of a topmost electrically conductive layer of the electrically conductive layers (146, 246).

In one embodiment, a lateral distance between the inner sidewall of the annular channel cap portion 60C and an outer sidewall of the annular channel cap portion 60C within a horizontal plane including a bottom periphery of the inner sidewall of the annular channel cap portion 60C is greater than a thickness of the vertically-extending channel portion 60V at a level of a topmost electrically conductive layer of the electrically conductive layers (146, 246).

In one embodiment, the at least one dopant species comprises a species selected from boron and argon; and the atoms of at least one dopant species are present within the annular channel cap portion 60C in a range from $1.0 \times 10^{18}/cm^3$ to 5 atomic percent. In one embodiment, the at least one dopant species comprises the boron and the argon; and boron atoms are present within the annular channel cap portion 60C at a higher concentration than in the vertically-extending channel portion 60V.

In one embodiment, an entirety of an interface between the annular channel cap portion 60C and the vertically-extending channel portion 60V is located above a horizontal plane including an interface between the lower insulating cap sublayer 27A and the upper insulating cap sublayer 27B.

In one embodiment, the lower insulating cap sublayer 27A comprises a first silicon oxide material having a first etch rate in 100:1 dilute hydrofluoric acid at room temperature; the upper insulating cap sublayer 27B comprises a second silicon oxide material having a second etch rate in 100:1 dilute hydrofluoric acid at room temperature that is higher than the first etch rate.

In one embodiment, the memory opening fill structure further comprises a dielectric core contacting an inner sidewall of the vertically-extending channel portion and contacting a bottom surface of the drain region, and the dielectric core does not contain a seam.

In one embodiment, the memory opening fill structure 58 comprises a first cylindrical surface segment contacting a cylindrical surface of the upper insulating cap sublayer 27B, a second cylindrical surface segment contacting a cylindrical surface of the lower insulating cap sublayer 27A and sidewalls of a subset of layers, and/or each insulating layer (132, 232), within the at least one alternating stack {(132, 146), (232, 246)}, and an annular surface segment connecting a bottom periphery of the first cylindrical surface segment and a top periphery of the second cylindrical surface segment and contacting the lower insulating cap sublayer 27A.

In one embodiment, each memory opening fill structure 58 may comprise a tapered surface segment contacting a tapered surface of the upper insulating cap sublayer 27B, and a cylindrical surface segment contacting a cylindrical surface of the lower insulating cap sublayer 27A and sidewalls of a subset of layers, and/or each of the insulating layers (132, 232), within the at least one alternating stack {(132, 146), (232, 246)} and adjoined to a bottom periphery of the tapered surface segment.

The various embodiments of the present provide thinning of the vertically-extending channel portions 60V of the vertical semiconductor channels 60 while preventing or reducing damage to the annular channel cap portion 60C and/or electrical disconnection between an upper ends of the vertically-extending channel portions 60V and the drain regions 63 during the dielectric core 62 planarization by selectively widening the memory opening 49 at the level of upper insulating cap sublayer 27B. Furthermore, the overhang of the annular channel cap portion 60C over the space to be filled by the dielectric core 62 may be reduced or eliminated by selectively widening the memory opening 49 at the level of upper insulating cap sublayer 27B. Thus, an undesirable seam formation in the dielectric core 62 can be reduced or eliminated.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers;
   an insulating cap layer including a stack of a lower insulating cap sublayer and an upper insulating cap sublayer and overlying the alternating stack;
   a memory opening vertically extending through the insulating cap layer and the alternating stack, wherein the memory opening has a greater lateral dimension at a level of the upper insulating cap sublayer than at a level of the lower insulating cap sublayer; and
   a memory opening fill structure located in the memory opening, wherein the memory opening fill structure comprises a memory film and a vertical semiconductor channel that includes a vertically-extending channel portion extending through alternating stack and having a first semiconductor material composition and an annular channel cap portion contacting a top end of the vertically-extending channel portion and having a second semiconductor material composition that differs from the first semiconductor material composition by presence of additional atoms of at least one dopant species;
   wherein an outer top periphery of the annular channel cap portion is laterally offset from an inner top periphery of the annular channel cap portion by a lateral distance that is greater than a thickness of the vertically-extending channel portion at a level of a topmost electrically conductive layer of the electrically conductive layers.

2. The three-dimensional memory device of claim 1, wherein the memory opening fill structure comprises a drain region having a doping of an opposite conductivity type than the vertical semiconductor channel and contacting an inner sidewall of the annular channel cap portion.

3. The three-dimensional memory device of claim 2, wherein the drain region contacts an entirety of the inner sidewall of the annular channel cap portion and an upper cylindrical surface segment of an inner sidewall of the vertically-extending channel portion.

4. The three-dimensional memory device of claim 2, wherein the memory opening fill structure further comprises a dielectric core contacting an inner sidewall of the vertically-extending channel portion and contacting a bottom surface of the drain region.

5. The three-dimensional memory device of claim 4, wherein the dielectric core does not contain a seam.

6. The three-dimensional memory device of claim 1, wherein:
   the lower insulating cap sublayer comprises a first silicon oxide material having a first etch rate in 100:1 dilute hydrofluoric acid at room temperature; and
   the upper insulating cap sublayer comprises a second silicon oxide material having a second etch rate in 100:1 dilute hydrofluoric acid at room temperature that is higher than the first etch rate.

7. The three-dimensional memory device of claim 1, wherein the memory opening fill structure comprises:
   a first cylindrical surface segment contacting a cylindrical surface of the upper insulating cap sublayer;
   a second cylindrical surface segment contacting a cylindrical surface of the lower insulating cap sublayer and sidewalls of a subset of layers within the alternating stack; and
   an annular surface segment connecting a bottom periphery of the first cylindrical surface segment and a top periphery of the second cylindrical surface segment and contacting the lower insulating cap sublayer.

8. The three-dimensional memory device of claim 1, wherein the memory opening fill structure comprises:
   a tapered surface segment contacting a tapered surface of the upper insulating cap sublayer; and
   a cylindrical surface segment contacting a cylindrical surface of the lower insulating cap sublayer and sidewalls of a subset of layers within the alternating stack and adjoined to a bottom periphery of the tapered surface segment.

9. The three-dimensional memory device of claim 1, wherein an entirety of an interface between the annular channel cap portion and the vertically-extending channel portion is located above a horizontal plane including an interface between the lower insulating cap sublayer and the upper insulating cap sublayer.

10. A three-dimensional memory device, comprising:
    an alternating stack of insulating layers and electrically conductive layers;
    an insulating cap layer including a stack of a lower insulating cap sublayer and an upper insulating cap sublayer and overlying the alternating stack;
    a memory opening vertically extending through the insulating cap layer and the alternating stack, wherein the memory opening has a greater lateral dimension at a level of the upper insulating cap sublayer than at a level of the lower insulating cap sublayer; and
   a memory opening fill structure located in the memory opening, wherein the memory opening fill structure comprises a memory film and a vertical semiconductor channel that includes a vertically-extending channel portion extending through alternating stack and having a first semiconductor material composition and an annular channel cap portion contacting a top end of the vertically-extending channel portion and having a second semiconductor material composition that differs from the first semiconductor material composition by presence of additional atoms of at least one dopant species;
    wherein an outer top periphery of the annular channel cap portion is laterally offset from an inner top periphery of the annular channel cap portion by a lateral distance that is greater than a thickness of the vertically-extending channel portion within a horizontal plane including an interface between the lower insulating cap sublayer and the upper insulating sublayer.

* * * * *